(12) United States Patent
Haneda et al.

(10) Patent No.: US 9,590,642 B2
(45) Date of Patent: Mar. 7, 2017

(54) CIRCUIT DEVICE, ELECTRONIC APPARATUS, AND MOVING OBJECT

(71) Applicant: Seiko Epson Corporation, Tokyo (JP)

(72) Inventors: Hideo Haneda, Matsumoto (JP); Takashi Kurashina, Matsumoto (JP); Katsuhiko Maki, Chino (JP); Yasuhiro Sudo, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/082,319

(22) Filed: Mar. 28, 2016

(65) Prior Publication Data

US 2016/0294397 A1 Oct. 6, 2016

(30) Foreign Application Priority Data

Mar. 30, 2015 (JP) ................ 2015-068078

(51) Int. Cl.
*H03L 7/06* (2006.01)
*H03L 7/085* (2006.01)
*H03L 7/099* (2006.01)

(52) U.S. Cl.
CPC .............. *H03L 7/085* (2013.01); *H03L 7/099* (2013.01)

(58) Field of Classification Search
None
See application file for complete search history.

(56) References Cited

U.S. PATENT DOCUMENTS

| 8,013,647 B2* | 9/2011 | Inukai | G01C 19/5607 327/160 |
| 2011/0179868 A1* | 7/2011 | Kaino | G01C 19/5607 73/504.12 |
| 2014/0312981 A1* | 10/2014 | Nakamura | H03L 7/02 331/34 |
| 2016/0269011 A1* | 9/2016 | Uehara | H03K 5/15013 |

FOREIGN PATENT DOCUMENTS

| JP | 2010-034722 A | 2/2010 |
| JP | 2012-217121 A | 11/2012 |

* cited by examiner

*Primary Examiner* — Cassandra Cox
(74) *Attorney, Agent, or Firm* — Harness, Dickey & Pierce, P.L.C.

(57) ABSTRACT

A circuit device includes a drive circuit that drives a physical quantity transducer, an FLL circuit that includes a frequency comparator and an oscillator, and generates a clock signal with a signal from the drive circuit as a reference clock signal, and a detection circuit that includes a circuit operated based on the clock signal, and performs detection processing on a detection signal from the physical quantity transducer.

20 Claims, 20 Drawing Sheets

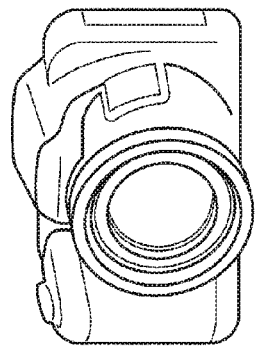
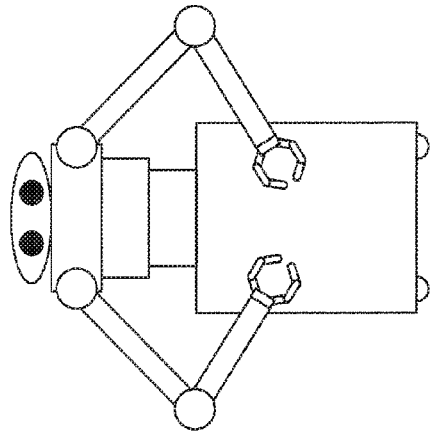
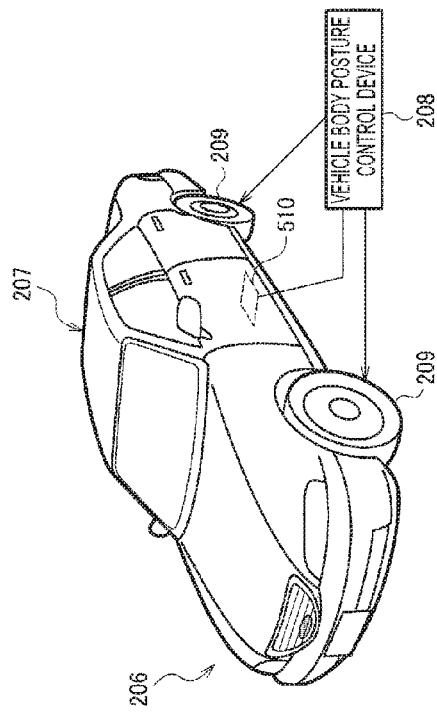
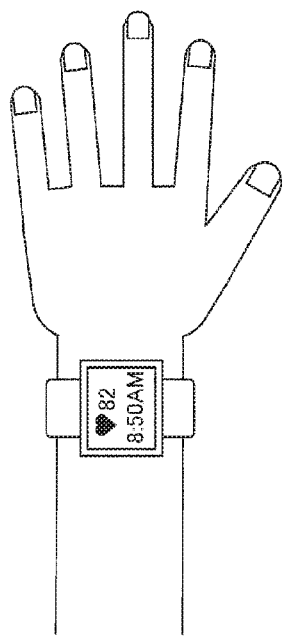

CIRCUIT DEVICE, ELECTRONIC APPARATUS, AND MOVING OBJECT

BACKGROUND

1. Technical Field

The present invention relates to a circuit device, an electronic apparatus, a moving object, and the like.

2. Related Art

In the related art, a circuit device that detects physical quantity based on a detection signal from a physical quantity transducer is known. As for an example of a gyro sensor, the circuit device detects an angular velocity or the like as the physical quantity. The gyro sensor performs image stabilization, posture control, GPS autonomous navigation or the like by using physical quantity such as an angular velocity or the like detected by being incorporated into an electronic apparatus such as digital cameras, smart phones, and the like, and the moving object such as vehicles and airplanes.

In the above circuit device, it is possible to realize a high speed operation of circuits when a method of generating a high speed clock signal from a clock signal generation circuit is adopted by providing the clock signal generation circuit having an oscillation circuit in a circuit device, in a case where a circuit for detecting physical quantity such as an A/D conversion circuit or a DSP unit (digital processing unit) is provided in a detection circuit.

However, when the method is adopted in the circuit device, there is a possibility that detection performance is deteriorated due to drive frequency components of a drive signal that drives the physical quantity transducer affects a circuit that is operated by a signal based on a clock signal generated from the clock signal generation circuit, in a case where a physical quantity detection apparatus is configured by connecting the physical quantity transducer and the circuit device.

JP-A-2010-34722 discloses a PLL circuit in which an A/D conversion circuit performs A/D conversion on a drive signal at an output clock of a voltage controlled oscillator, and which performs feedback control on the voltage controlled oscillator such that the drive signal is sampled at the zero point (zero phase of sine wave) in the A/D conversion. In addition, JP-A-2012-217121 discloses a PLL circuit that synchronizes a phase with a drive signal according to phase comparison of digital processing using a counter. Accordingly, JP-A-2010-34722 and JP-A-2012-217121 are techniques that generate a clock signal for synchronizing a phase with respect to a drive signal by the PLL circuit.

SUMMARY

An advantage of some aspects of the invention is to provide a circuit device, an electronic apparatus, and a moving object in which deterioration of detection performance generated due to affecting of drive frequency components of a physical quantity transducer with respect to a detection circuit is reduced.

An aspect of the invention relates to a circuit device including a drive circuit that drives a physical quantity transducer; an FLL circuit that includes a frequency comparator and an oscillator, and generates a clock signal with a signal from the drive circuit as a reference clock signal; and a detection circuit that includes a circuit operated based on the clock signal and performs detection processing on a detection signal from the physical quantity transducer.

According to the aspect of the invention, the clock signal is generated by the FLL circuit with the signal from the drive circuit as the reference clock signal, and detection processing is performed on the detection signal from the physical quantity transducer by the detection circuit including the circuit operated based on the clock signal generated by the FLL circuit. It is possible to reduce the deterioration of detection performance generated due to affecting of drive frequency components of the physical quantity transducer with respect to the detection circuit.

In the aspect of the invention, the frequency comparator may include a divider circuit that divides the reference clock signal, and a comparator that performs comparison processing of a comparison target value based on a divided clock signal from the divider circuit and the clock signal from the oscillator, and a reference value of the comparison target value.

According to this configuration, it is possible to realize frequency comparison by performing comparison processing of the comparison target value based on the divided clock signal in which the reference clock signal is divided and the clock signal from the oscillator and the reference value of the comparison target value, and to control an oscillation frequency of the oscillator based on the frequency comparison result. In addition, it is possible to perform frequency comparison by digital processing and to simplify the frequency comparator by implementing the configuration.

In the aspect of the invention, the frequency comparator further may include a counter that outputs, as the comparison target value, a count value measured by counting a measurement period defined by the divided clock signal based on the clock signal.

According to this configuration, it is possible to obtain, as the comparison target value, the count value based on the divided clock signal and the clock signal by counting a measurement period defined by the divided clock signal based on the clock signal. Therefore, it is possible to realize frequency comparison by performing comparison processing on the count value and a reference value of the count value.

In the aspect of the invention, in a case where the reference value is SC, a division ratio of the divider circuit is DR, a frequency of a signal from the drive circuit is FR, and a frequency of the clock signal output from the oscillator is FV, FV=(SC/DR)×FR may be satisfied.

According to this configuration, a frequency ratio of the frequency FV of the clock signal and the frequency FR of the signal from the drive circuit is SC/DR. It is possible to reliably avoid interference frequency in which drive frequency components of the physical quantity transducer and operation frequency of the detection circuit interfere with each other, by constantly maintaining the frequency ratio, and to reduce deterioration of detection performance.

In the aspect of the invention, the SC/DR may be a decimal.

According to this configuration, SC/DR≠j×i is satisfied from j×FR≠FV/i and FV=(SC/DR)×FR. That is, it is possible to generate a clock signal that avoids interference frequency by setting SC/DR to a decimal.

In the aspect of the invention, the SC may be a decimal.

According to this configuration, it is possible for the SC/DR to set a given decimal, even in a case where the division ratio DR of the divider circuit is small, and to set an appropriate frequency ratio SC/DR to avoid interference frequency.

In the aspect of the invention, the circuit may be operated by an operational signal based on the clock signal, and the SC/DR may be set so as to satisfy j×FR≠FV/i, in a case where i is an integer equal to or greater than one, j is an integer equal to or greater than one, and a frequency of the operational signal is FV/i.

According to this configuration, in a case where an operational signal is generated based on a clock signal from an oscillator in which a frequency is not locked and an oscillation frequency of the oscillator is fos, interference frequency is a frequency fos so as to satisfy j×FR=fos/i. In this respect, according to the aspect of the invention, it is possible to reliably avoid interference frequency because the frequency ratio SC/DR is set such that the frequency FV of the clock signal satisfies j×FR≠FV/i and the frequency ratio SC/DR is constantly maintained by the FLL circuit.

In the aspect of the invention, the oscillator may include a CR oscillation circuit that sets an oscillation frequency setting value based on an output of the frequency comparator, and oscillates based on the oscillation frequency setting value.

According to this configuration, an oscillation frequency of the CR oscillation circuit is varied by temperature characteristics or manufacturing variations of a resistor, a capacitor, or a transistor that constitutes the CR oscillation circuit. There is a possibility that an operation frequency of circuit matches with the interference frequency according to the variation in a case where a clock signal generated from the CR oscillation circuit is supplied to the detection circuit. In this respect, according to the aspect of the invention, since the oscillation frequency of the CR oscillation circuit is controlled by the FLL circuit, it is possible to maintain the oscillation frequency that avoids interference frequency.

In the aspect of the invention, the CR oscillation circuit may include at least one of a variable capacitance circuit and a variable resistance circuit, and an oscillation frequency of the CR oscillation circuit may be set by setting a capacitance value of the variable capacitance circuit or a resistance value of the variable resistance circuit according to the oscillation frequency setting value.

According to this configuration, it is possible to realize feedback control of the oscillation frequency by the FLL circuit and to maintain the oscillation frequency that avoids interference frequency by setting the capacitance value of the variable capacitance circuit or the resistance value of the variable resistance circuit according to the oscillation frequency setting value.

In the aspect of the invention, the CR oscillation circuit may include a variable capacitance circuit and a variable resistance circuit, the variable resistance circuit may have a plurality of resistance elements connected in series, and a plurality of fuse elements each of which is provided in parallel with each resistance element of the plurality of resistance elements, and the variable capacitance circuit may be a circuit of which a capacitance value is set according to the oscillation frequency setting value.

According to this configuration, it is possible to adjust a resistance value of the variable resistance circuit by cleavage of the fuse element. Therefore, according to the adjustment, it is possible to perform coarse adjustment of the oscillation frequency so that a desired oscillation frequency is within an adjustment range of an oscillation frequency according to the oscillation frequency setting value.

In the aspect of the invention, a loop filter may be provided between the frequency comparator and the oscillator.

In the aspect of the invention, the loop filter may include an integrator that integrates an output of the frequency comparator, and a gain processing unit that performs gain processing on an output of the integrator.

According to this configuration, it is possible to perform feedback control of the oscillation frequency by delta-sigma modulation by providing the frequency comparator and the integrator that integrates an output of the frequency comparator in the FLL circuit. With this, it is possible to generate a clock signal that is a desired oscillation frequency as time average, even in a case where a discrete oscillation frequency is selected by the oscillation frequency setting value.

In the aspect of the invention, the detection circuit may include at least one of an A/D conversion circuit and a digital signal processing unit as the circuit operated based on the clock signal.

In the aspect of the invention, the circuit device may include a controller that is operated based on the clock signal, and controls the drive circuit and the detection circuit.

According to this configuration, there is a possibility that the deterioration of detection performance is generated by interfering of drive frequency components of the physical quantity transducer with an operation frequency of the A/D conversion circuit or the digital signal processing unit. In this respect, according to the aspect of the invention, since the operation frequency that avoids interference frequency can be realized, it is possible to reduce the deterioration of detection performance.

Another aspect of the invention relates to an electronic apparatus including any of the circuit devices described above.

Still another aspect of the invention relates to a moving object including any of the circuit devices described above.

BRIEF DESCRIPTION OF THE DRAWINGS

The invention will be described with reference to the accompanying drawings, wherein like numbers reference like elements.

FIGS. 20A to 20D are examples of a moving object and an electronic apparatus incorporated with the circuit device of the embodiment.

DESCRIPTION OF EXEMPLARY EMBODIMENTS

Hereinafter, preferred embodiments of the invention will be described in detail. In addition, the embodiment described below is not intended to unduly limit the content of the invention in the appended claims, and all configurations described in the embodiment are not necessarily essential as solving means of the invention.

1. Example of Configuration of Circuit Device

Figure 1:
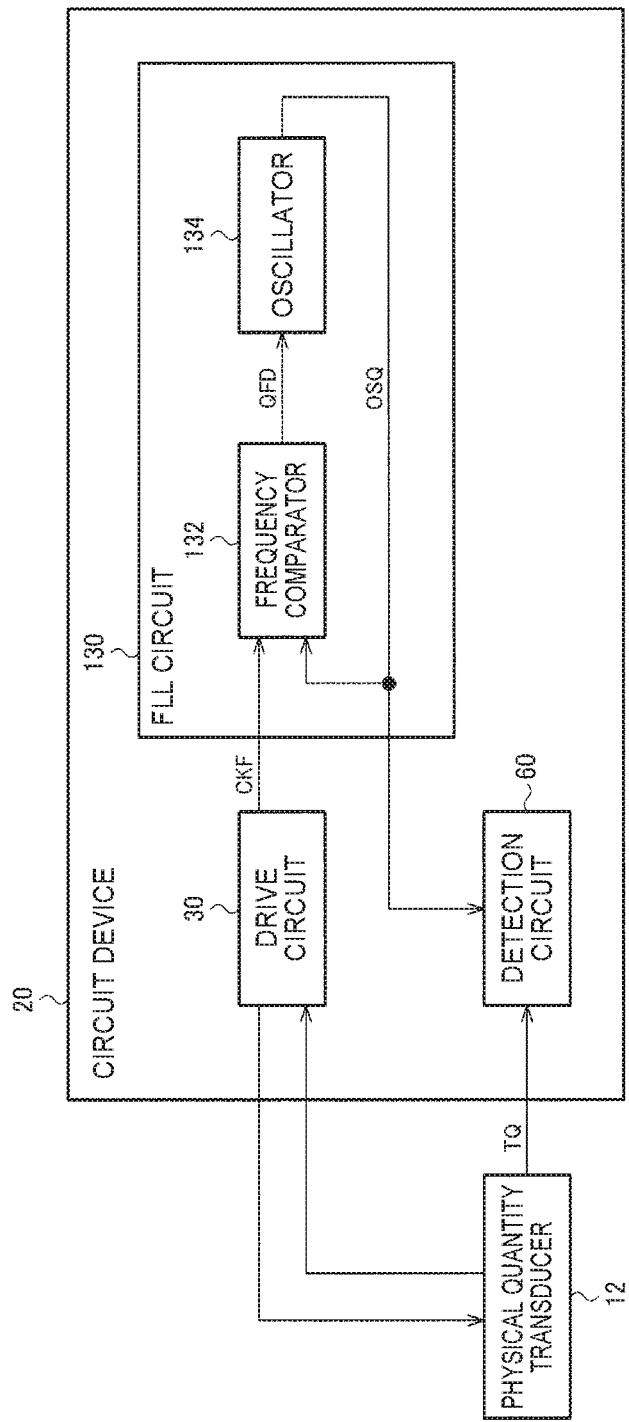
FIG. 1 is an example of a configuration of a circuit device of the present embodiment.

FIG. 1 illustrates an example of a configuration of a circuit device according to the embodiment. A circuit device 20 includes a drive circuit 30 that drives a physical quantity transducer 12, a frequency locked loop (FLL) circuit 130 that generates a clock signal OSQ with a signal from the drive circuit 30 as a reference clock signal CKF, and a detection circuit 60 that performs detection processing on a detection signal TQ from the physical quantity transducer 12.

The FLL circuit 130 is a circuit that generates the clock signal OSQ where a frequency ratio (multiplication ratio) with respect to the reference clock signal CKF is constantly maintained (locked). A phase of the clock signal OSQ may not be synchronized with a phase of the reference clock signal CKF. The FLL circuit 130 includes a frequency comparator 132 that compares frequencies of the reference clock signal CKF and the clock signal OSQ, and an oscillator 134 that oscillates at a frequency corresponding to an output value QFD (output signal) of the frequency comparator 132. By this feedback loop, a frequency ratio of the reference clock signal CKF and the clock signal OSQ is locked. In addition, the reference clock signal CKF is a clock signal generated based on a signal in the drive circuit 30, for example, a clock signal with a frequency the same as or two times that of the drive frequency of the physical quantity transducer 12.

The detection circuit 60 includes a circuit operated based on the clock signal OSQ. That is, the circuit is operated based on the clock signal OSQ where a frequency ratio is constantly maintained with respect to the reference clock signal CKF from the drive circuit 30.

The detection circuit 60 receives the detection signal TQ from the physical quantity transducer 12 including frequency components of the drive signal. That is, the circuit operated based on the clock signal OSQ processes a signal including the frequency components of the drive signal. According to the embodiment, since a frequency ratio of the clock signal OSQ and the drive signal can be constantly maintained by the FLL circuit 130, it is possible to reduce the deterioration of detection performance generated due to drive frequency components effecting with respect to the detection circuit. In this respect, it will be described below in detail.

The detection circuit 60 of the embodiment includes, as a circuit operated based on the clock signal OSQ, at least one of an A/D conversion circuit and a digital signal processing unit. Hereinafter, a case where the detection circuit 60 includes the A/D conversion circuit and the digital signal processing unit will be described as an example. However, it is possible to apply the invention to a case where any one of the A/D conversion circuit and the digital signal processing unit is not included.

In the related art, the circuits are operated by a signal based on a drive signal of the drive circuit 30 that drives the physical quantity transducer 12. However, the drive frequency of the drive signal is not high (for example, 50 kHz to 150 kHz). Therefore, there is a problem that it is difficult to realize a high speed operation of a circuit for detecting physical quantity of the A/D conversion circuit, the digital signal processing unit, or the like.

Figure 2:
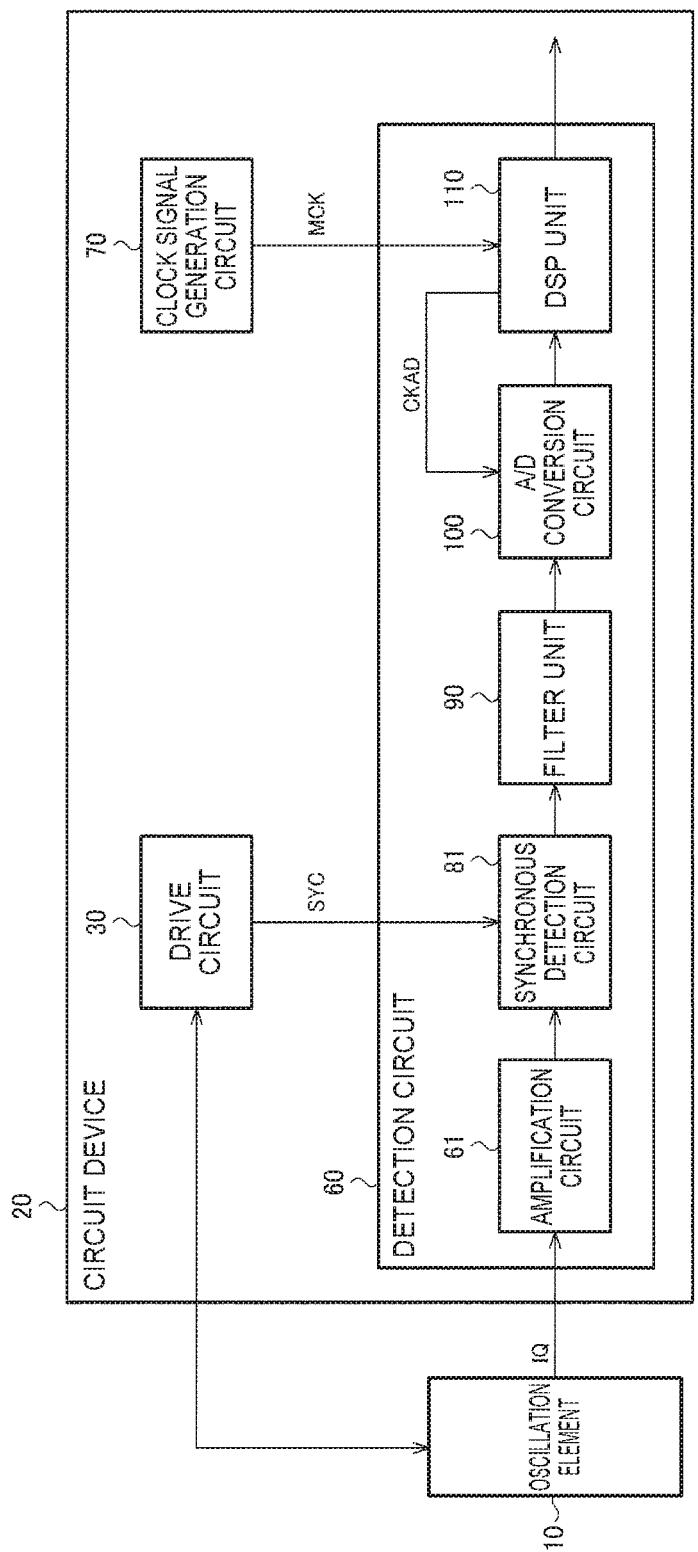
FIG. 2 is a comparison example of the configuration of the circuit device.

As a method for solving this problem, a method is adopted in which a clock signal generation circuit including an oscillation circuit is provided in the circuit device and a high speed clock signal is generated by the clock signal generation circuit. FIG. 2 illustrates a comparison example of the configuration of the circuit device in this case. FIG. 2 is a comparison example of the configuration in a case where the physical quantity transducer is an oscillation element 10 (angular velocity sensor element).

The circuit device 20 includes the drive circuit 30, the detection circuit 60, and a clock signal generation circuit 70. The detection circuit 60 includes an amplification circuit 61 that amplifies a detection signal IQ from the oscillation element 10, a synchronous detection circuit 81 that synchronously detects a signal from the amplification circuit 61 by a synchronous signal SYC from the drive circuit 30, a filter unit 90 that performs low pass filter processing on a signal from the synchronous detection circuit 81, an A/D conversion circuit 100 that performs A/D conversion on a signal from the filter unit 90, and a DSP unit 110 (digital signal processing unit) that outputs angular velocity information by performing digital processing on a signal from the A/D conversion circuit 100.

A master clock signal MCK generated by the clock signal generation circuit 70 is input to the DSP unit 110, and the DSP unit 110 is operated based on the master clock signal MCK. In addition, the DSP unit 110 generates a clock signal CKAD for A/D conversion by dividing the master clock signal MCK, and the A/D conversion circuit 100 performs an A/D conversion operation based on the clock signal CKAD.

Since the master clock signal MCK is generated by an oscillation circuit included in the clock signal generation circuit 70, the clock signal generation circuit 70 can output a master clock signal MCK with a frequency higher than a drive frequency of the oscillation element 10. With this, it is possible to perform the high speed operation of the A/D conversion circuit 100 or the DSP unit 110.

Accordingly, an oscillation frequency of the oscillation circuit is varied by various factors such as temperature dependence and manufacturing variations. For example, a CR oscillator as the oscillation circuit can be assumed. However, the oscillation frequency of the CR oscillator is not constant due to temperature characteristics and manufacturing variations of capacitors, resistors, and transistors constituting the CR oscillator. In a case where the variation of the oscillation frequency is generated, there is a possibility that variation of an angular velocity code is generated, which results from interference between the frequency of the drive signal and the operation frequency of the A/D conversion circuit 100 or the DSP unit 110, according to the variation of a frequency ratio of the master clock signal MCK and the drive signal.

Figure 3:
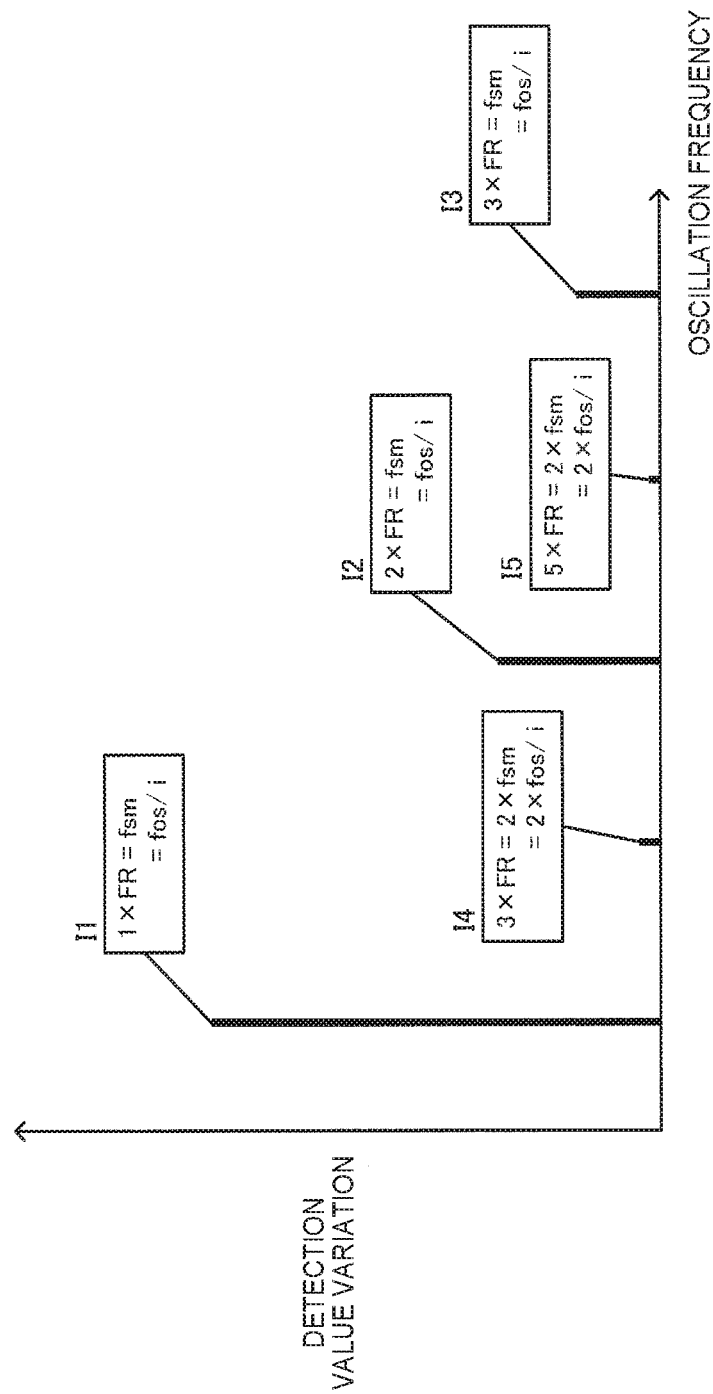
FIG. 3 is an explanatory diagram illustrating interference frequencies.

FIG. 3 is an explanatory diagram with respect to interference frequencies. A horizontal axis in FIG. 3 is the oscillation frequency, and a vertical axis is the magnitude of angular velocity code variation.

The oscillation frequency of the oscillation circuit included in the clock signal generation circuit 70 is fos, i, j, and k are integers equal to or greater than one, the frequency of an operational signal such as a sampling clock signal is fsm=fos/i, and the frequency of the drive signal is FR. In a case where i≥2, i corresponds to a division ratio of the clock signal, and fos/i is the frequency of the operational signal such as a sampling clock signal that is divided by the division ratio i.

In this case, the interference frequency is an oscillation frequency when j×FR=k×fos/i is satisfied. That is, a relationship equation of j×FR=k×fos/i is satisfied, in a case where fos=fin, when the interference frequency is fin.

For example, 1×FR=fsm=fos/i is satisfied in the interference frequency illustrated by I1 of FIG. 3. For example, 1×FR=fos/i=fin 1/i is satisfied when the interference frequency of I1 is fos=fin 1. This corresponds to a case of j=1 and k=1 in a relationship equation (interference condition) of j×FR=k×fos/i.

In addition, 2×FR=fsm=fos/i is satisfied in the interference frequency illustrated by I2. For example, 2×FR=fos/i=fin 2/i is satisfied when the interference frequency illustrated by I2 is fos=fin 2. This corresponds to a case of j=2 and k=1 in the relationship equation of j×FR=k×fos/i.

In addition, 3×FR=fsm=fos/i is satisfied in the interference frequency illustrated by I3. For example, 3×FR=fos/i=fin 3/i is satisfied when the interference frequency illustrated by I3 is fos=fin 3. This corresponds to a case of j=3 and k=1 in the relationship equation of j×FR=k×fos/i.

In addition, 3×FR=2×fsm=2×fos/i is satisfied in the interference frequency illustrated by I4. For example, 3×FR=2×fos/i=2×fin 4/i is satisfied when the interference frequency illustrated by I4 is fos=fin 4. This corresponds to a case of j=3 and k=2 in the relationship equation of j×FR=k×fos/i.

In addition, 5×FR=2×fsm=2×fos/i is satisfied in the interference frequency illustrated by I5. For example, 5×FR=2×fos/i=2×fin 5/i is satisfied when the interference frequency illustrated by I5 is fos=fin 5. This corresponds to a case of j=5 and k=2 in the relationship equation of j×FR=k×fos/i.

In this way, the interference condition represented as the relation equation of j×FR=k×fsm=k×fos/i is satisfied in the interference frequency. Here, j×FR corresponds to harmonic component (j≥2) or fundamental component (j=1) of the drive frequency FR. In addition, fsm=fos/i is a sampling frequency (broadly, frequency of an operational signal) of the A/D conversion circuit 100. Accordingly, j×FR=k×fos/i that is an interference condition is a condition where the harmonic component (j≥2) or the fundamental component (j=1) of the drive frequency FR matches with k times the sampling frequency fos/i.

In addition, the angular velocity code variation in the interference frequency illustrated in FIG. 3 is generated due to a cause that frequency components (drive frequency component) of an unwanted signal mixed with an input signal of the A/D conversion circuit 100 folding in a signal bandwidth by a sampling operation of the A/D conversion circuit 100. Accordingly, the angular velocity code variation in the interference frequency is remarkable in actuality, in a case where the frequency difference Δf between j×FR and k×fsm is sufficiently small, and not in a case where the j×FR and k×fsm are completely matched. Specifically, since the folding noise caused by the frequency difference Δf is generated in the signal bandwidth in a case where the frequency difference Δf is lower than a frequency (for example, 10 Hz to 200 Hz) of a signal bandwidth that is a frequency bandwidth of a desired signal, a problem of angular velocity code variation (shaking) is generated. In a case where the frequency difference Δf is large, since the folding noise is sufficiently reduced by a low pass filter for bandwidth limitation of the DSP unit 110, the angular velocity code variation is also not generated. In this manner, it can be said that the interference frequency to be avoided in the embodiment has a predetermined frequency bandwidth (signal bandwidth, Δf).

In the embodiment, a method is adopted which sets the frequency of the clock signal OSQ output from the FLL circuit 130 in a frequency that avoids interference frequency. That is, in a case where a frequency of the clock signal OSQ is FV, i and j are integers equal to or greater than one, and a frequency of the operational signal is FV/i, the frequency FV of the clock signal OSQ is set such that j×FR≠FV/i is satisfied. The frequency FV/i of the operational signal is a frequency of the sampling clock signal of the A/D conversion circuit 100 or an operation clock signal (output data rate) of the DSP unit 110.

Specifically, in an example of a configuration of the FLL circuit 130 described below in FIG. 4 or the like, FV=(SC/DR)×FR is satisfied in a case where a reference value input into the comparator 131 is SC and a division ratio of the divider circuit 133 is DR. In this case, the frequency FV of the clock signal OSQ is set to a frequency that avoids interference frequency by setting SC/DR (SC/DR≠j×i) such that j×FR≠FV/i is satisfied.

In this manner, it is possible to set the frequency FV to the frequency that avoids interference frequency (j×FR=1×fos/i) illustrated by I1, I2, and I3 in FIG. 3 when the frequency FV is set to satisfy j×FR≠FV/i. Accordingly, it is possible to reduce the generation of the angular velocity code variation with large values illustrated by I1, I2, and I3, and to reduce deterioration of the detection performance.

Further, it is preferable that the frequency FV is set to satisfy j×FR≠k×FV/i in a case where k is an integer equal to or greater than one in the embodiment. That is, the frequency FV is set to the frequency that avoids, not only the interference frequency of a case of k=1 illustrated by I1, I2, and I3 in FIG. 3, but also the interference frequency (j×FR=k×fos/i) of a case of k≥2 illustrated by I4 and I5. By doing so, it is possible to prevent not only the generation of the angular velocity code variation with a large value illustrated by I1, I2, and I3, but also the generation of the angular velocity code variation with a relatively small value illustrated by I4 and I5.

In addition, as described above, since it is preferable that the oscillation frequency of the FLL circuit 130 avoids the interference frequency, it is not necessary for phases of the reference clock signal CKF and the clock signal OSQ to be locked (synchronization). That is, the frequency comparator 45 may be a circuit capable of comparing frequencies, or not comparing phases. Accordingly, the FLL circuit 130 may be a circuit capable of locking a frequency ratio of the reference clock signal CKF and the clock signal OSQ.

2. First Example of Configuration of FLL Circuit

Figure 4:
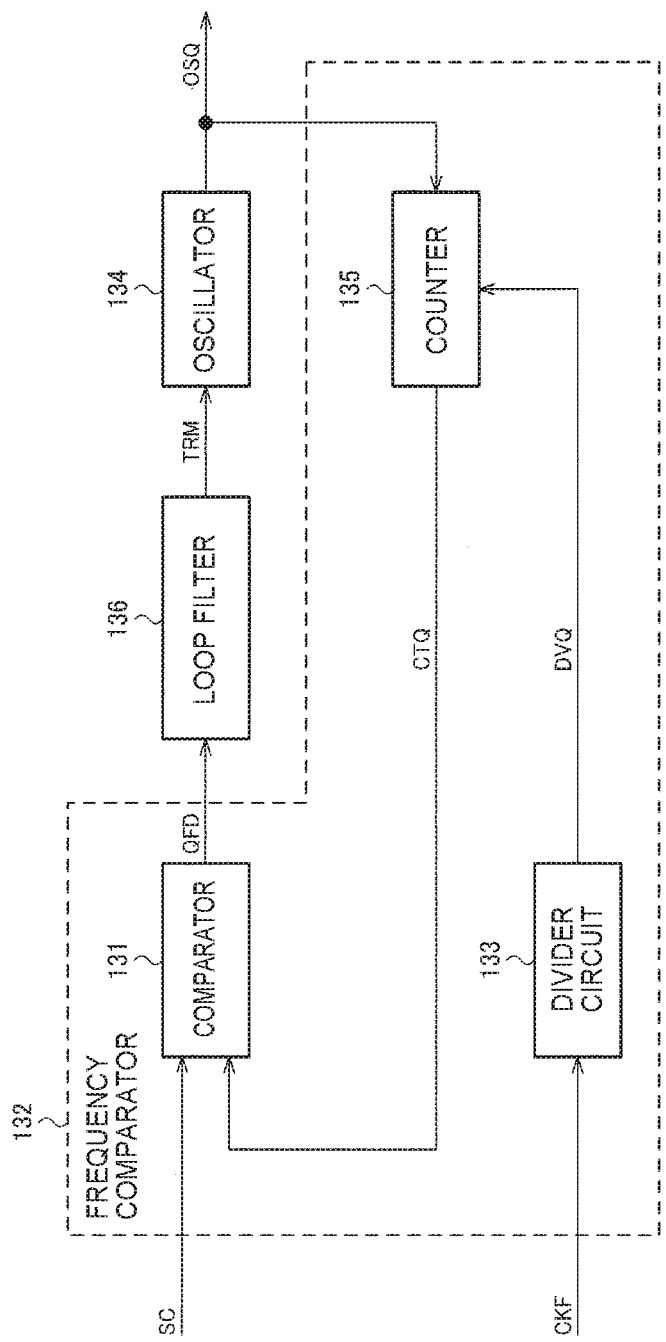
FIG. 4 is a first example of the configuration of an FLL circuit according to the embodiment.

FIG. 4 illustrates a first example of a configuration of the FLL circuit of the embodiment. The FLL circuit 130 includes the frequency comparator 132, a loop filter 136, and the oscillator 134. The frequency comparator 132 includes the comparator 131, the divider circuit 133, and a counter 135.

The divider circuit 133 divides the reference clock signal CKF from the drive circuit 30. The comparator 131 performs comparison processing of a comparison target value CTQ based on a divided clock signal DVQ from the divider circuit 133 and the clock signal OSQ from the oscillator 134 and a reference value SC of the comparison target value CTQ. The counter 135 outputs, as a comparison target value CTQ, a count value measured by counting a measurement period defined at the divided clock signal DVQ based on the clock signal OSQ.

Specifically, a cycle of the divided clock signal DVQ is a measurement period, the counter 135 counts the clock signal OSQ in the measurement period, and a count value when the measurement period is completed is output as a comparison target value CTQ. The comparator 131 outputs the output value QFD based on the difference between the comparison target value CTQ and the reference value SC. The loop filter 136 provided between the frequency comparator 132 and the oscillator 134 outputs an oscillation frequency setting value TRM (trimming value) by performing filter processing (for example, integration processing, low pass filtering, or the like) on the output value QFD. The oscillator 134 sets the oscillation frequency setting value TRM based on an output value QFD of the frequency comparator 132, and oscillates based on the oscillation frequency setting value TRM. That is, the oscillation frequency setting value TRM is a setting value that can obtain a plurality of values within a predetermined range, and the oscillator 134 is configured to vary the oscillation frequency of the oscillator 134 according to the setting value.

In a case where the comparison target value CTQ and the reference value SC are deviated, the output value QFD is varied, the oscillation frequency setting value TRM is varied, the frequency of the clock signal OSQ is varied, and the comparison target value CTQ is varied. The oscillation frequency of the oscillator 134 is controlled by the feedback control, and a frequency ratio is constantly maintained with respect to the frequency of the reference clock signal CKF from the drive circuit 30.

In the first example of the configuration, it is possible to configure the frequency comparator 132 and the loop filter 136 by a logic circuit (digital circuit). Since it is possible to configure a portion excluding the oscillator 134 as the logic circuit, it is possible to realize simplification, area reduction, or the like of the circuit compared to a case configured by an analog circuit.

3. Second Example of Configuration of FLL Circuit

Figure 5:
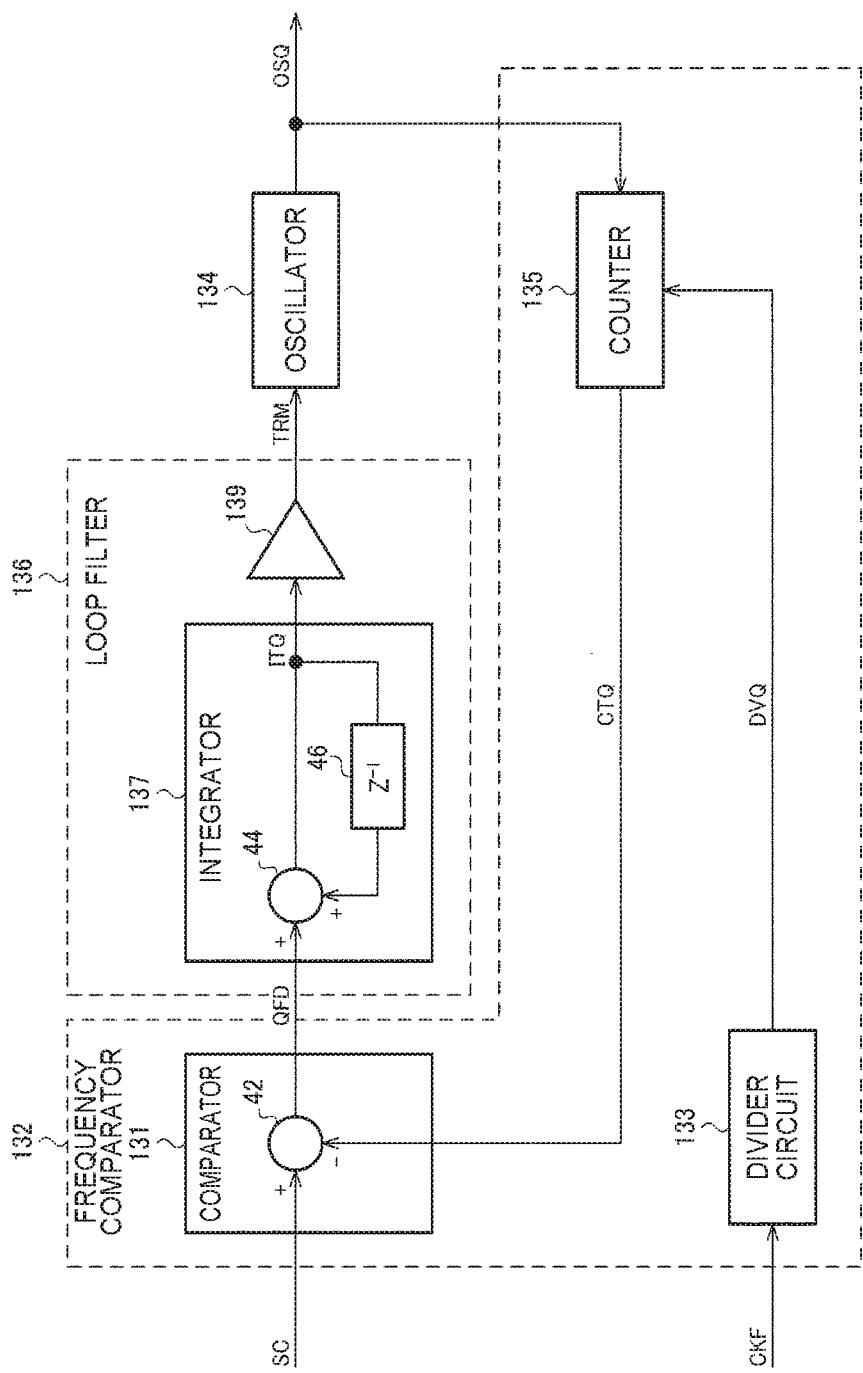
FIG. 5 is a second example of the configuration of the FLL circuit according to the embodiment.

FIG. 5 illustrates a second example of the configuration of the FLL circuit according to the embodiment. The FLL circuit 130 includes the frequency comparator 132, the loop filter 136, and the oscillator 134. The frequency comparator 132 includes the comparator 131, the divider circuit 133, and the counter 135. The loop filter 136 includes an integrator 137 and a gain processing unit 139. In the following, the same reference numerals are denoted for the same components as those already described, and the description thereof will not be repeated.

The comparator 131 is a subtractor, performs differential processing on the comparison target value CTQ from the counter 135 and the reference value SC, and outputs the difference value QFD obtained from the differential processing.

The integrator 137 integrates an output (difference value QFD) of the frequency comparator 132, and outputs the integration value ITQ obtained from the integration. Specifically, the integrator 137 includes a delay circuit 46 (for example, latch circuit or the like) that delays the integration value ITQ by as much as one cycle of the divided clock signal DVQ and an adder 44 that performs addition processing of an output of delay circuit 46 and the integration value ITQ. The output of the adder 44 becomes the integration value ITQ.

The gain processing unit 139 performs gain processing on an output (integration value ITQ) of the integrator 137, and outputs a value obtained from the gain processing as the oscillation frequency setting value TRM. The gain processing is processing of multiplying a gain by the integration value ITQ.

However, the oscillator 134 oscillates at a discrete oscillation frequency according to the digital oscillation frequency setting value TRM. Therefore, when the oscillation frequency setting value TRM is constant, the oscillation frequency setting value TRM is fixed into one of the discrete oscillation frequencies, and the clock signal OSQ of a desired frequency ratio cannot be obtained with respect to the drive frequency (error is generated in the frequency ratio). In this respect, according to the embodiment, it is possible to perform delta-sigma modulation on the frequency of the clock signal OSQ by providing the comparator 131 (subtractor) and the integrator 137 in a loop of the FLL circuit 130. That is, it is possible to obtain the clock signal OSQ of a desired frequency ratio as an average frequency with respect to the drive frequency by varying the frequency of the clock signal OSQ by the modulation in time series.

Figure 6:
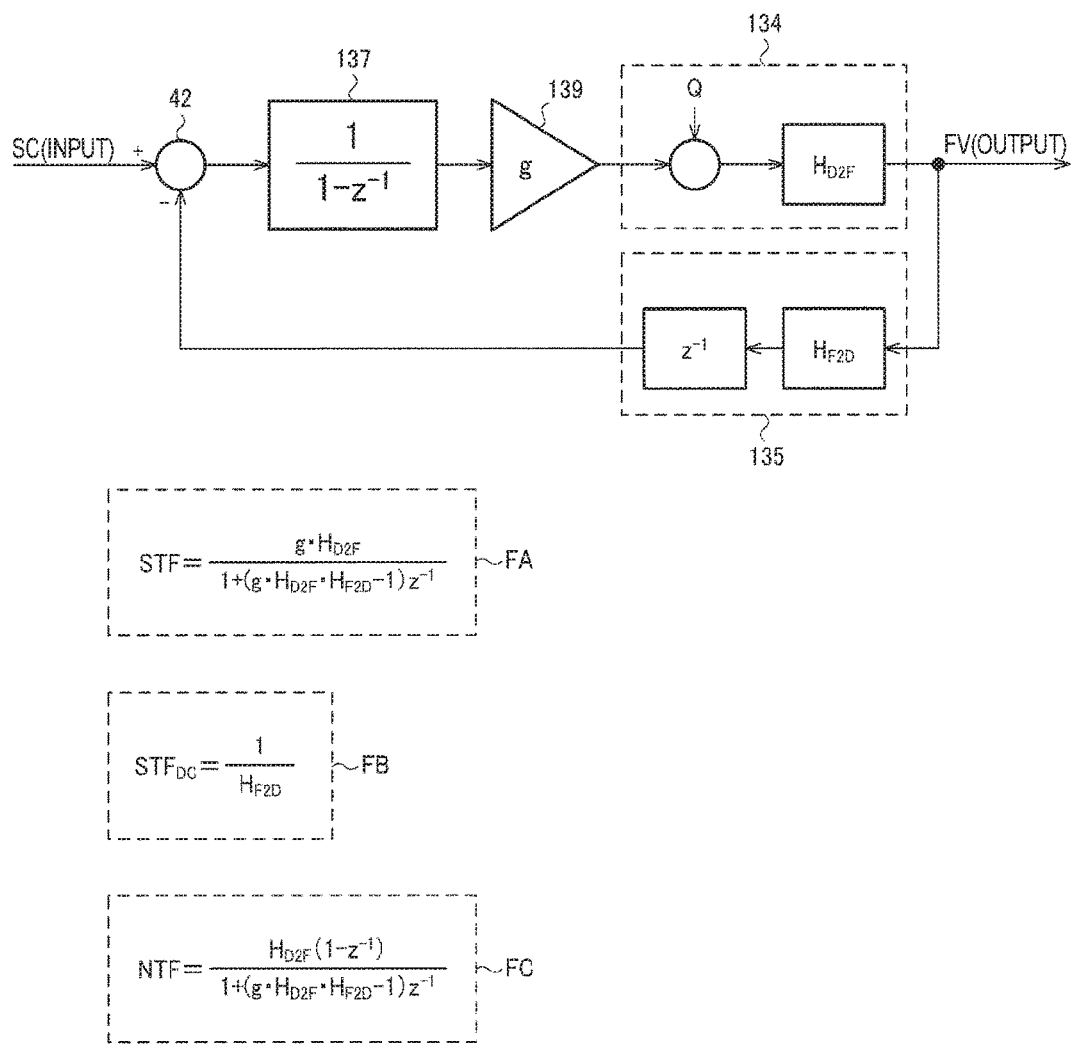
FIG. 6 is an explanatory diagram illustrating a transfer function of the FLL circuit according to the embodiment.

Hereinafter, an operation of the above example of the configuration will be described in detail. FIG. 6 is an explanatory diagram illustrating a transfer function of the FLL circuit 130 of FIG. 5.

The transfer function of each component is described in the equivalent circuit diagram of FIG. 6. SC is a reference value and an input of an equivalent circuit. g is a gain to be multiplied by an integration value. Q is quantization noise when the oscillator 134 is regarded as a quantizer. $H_{D2F}$ is a coefficient for converting an oscillation frequency setting value that is a digital value into the oscillation frequency FV of the oscillator 134. For example, $H_{D2F}$=200 kHz/10=20 kHz, in a case where a decimal digital value of 10 is converted into frequency 200 kHz. The oscillation frequency FV is an output of the equivalent circuit. $H_{F2D}$ is a coefficient for converting the oscillation frequency FV of the oscillator 134 into a count value (comparison target value) of the counter 135. For example, $H_{F2D}$=2000/200 kHz=10 ms (100 Hz), in a case where a frequency of 200 kHz is converted into a count value of 2000. The value corresponds to a measurement period in the counter 135. Since the counter 135 outputs a count value that is counted during the measurement period after the measurement period is terminated, the value is a count value before one cycle in the loop. Therefore, a delay circuit ($Z^{-1}$) is included as an equivalent circuit of the counter 135.

From the equivalent circuit, a transfer function STF=FV/SC of the FLL circuit 130 is represented by equation FA. The transfer function STF has low pass characteristics, and DC characteristics $STF_{DC}$ (transfer function STF when $\omega$=0) thereof is represented by equation FB. In addition, a noise transfer function NFT=FV/Q of the FLL circuit 130 is equation FC. The noise transfer function NFT is high pass characteristics, and has small noise in the low frequency.

That is, the quantization noise is reduced in a case where average of the oscillation frequency FV is processed in time.

In a case where a division ratio of the divider circuit 133 is DR and a frequency of the reference clock signal CKF from the drive circuit 30 is FR, since a measurement period in the counter 135 is 1/(FR/DR)=DR/FR, $H_{F2D}$=DR/FR is satisfied. Since DC characteristics satisfy $STF_{DC}$=FV/SC=1/$H_{F2D}$ by the equation FB, FV/SC=FR/DR and FV=(SC/DR)×FR are satisfied. That is, a ratio between the frequency FV of the clock signal OSQ generated from the FLL circuit 130 and the frequency FR of the reference clock signal CKF from the drive circuit 30 is SC/DR.

As described in FIG. 3, the interference frequency is an oscillation frequency fos where j×FR=k×fos/i is satisfied. In the embodiment, the frequency FV of the clock signal OSQ to avoid interference frequency is set to satisfy j×FR≠k×FV/i. That is, the frequency is set to FV/FR=SC/DR ≠ (j×i)/k.

(j×i)/k is an integer equal to or greater than one in a case where k=1, (j×i)/k is a fraction (decimal) or an integer equal to or greater than one in a case where k≥2. Therefore, the SC/DR is set to a decimal in the embodiment. With this, it is possible to avoid interference frequency in a case where at least k=1, and interference frequency in a case where (j×i)/k is an integer and in a case where k≥2. In addition, even in a case where (j×i)/k is a fraction, it is possible to avoid interference frequency by setting the SC/DR to avoid the fraction.

In addition, the reference value SC may be set to a decimal in the embodiment. In this case, it is possible to set the SC/DR to a given decimal, even if the division ratio DR is small. That is, it is necessary to reduce the division ratio DR in a case where a comparison period (measurement period) is desired to be shortened by the comparator 131. For example, a fractional part except for the integer part of the SC/DR is 0.333 . . . or 0.666 . . . , and options that can be taken as a fraction are limited in a case where the reference value SC is an integer and the division ratio is DR=3. In this respect, it is possible to set the SC/DR to a given decimal by setting the reference value SC to a decimal.

Figure 18:
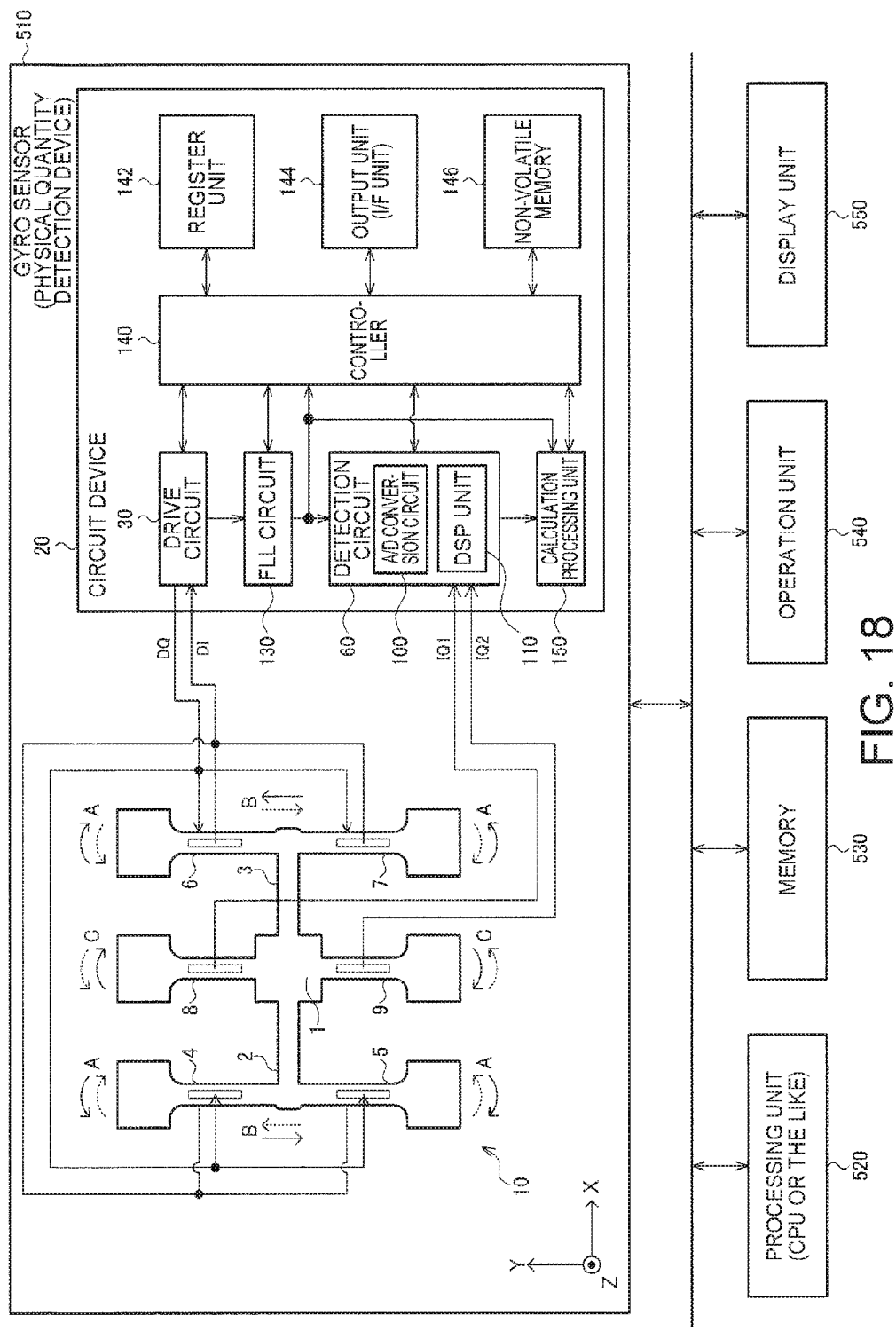
FIG. 18 is an example of a configuration of the circuit device, an electronic apparatus, and a gyro sensor (physical quantity detection apparatus) according to the embodiment.

In addition, the parameters described above (reference value SC, division ratio DR, and gain of gain processing unit 139) may be, for example, parameters of a configuration that is written in a register unit (for example, register unit 142 of FIG. 18) of the circuit device 20 from an external processing unit (for example, processing unit 520 in FIG. 18).

Figure 7:
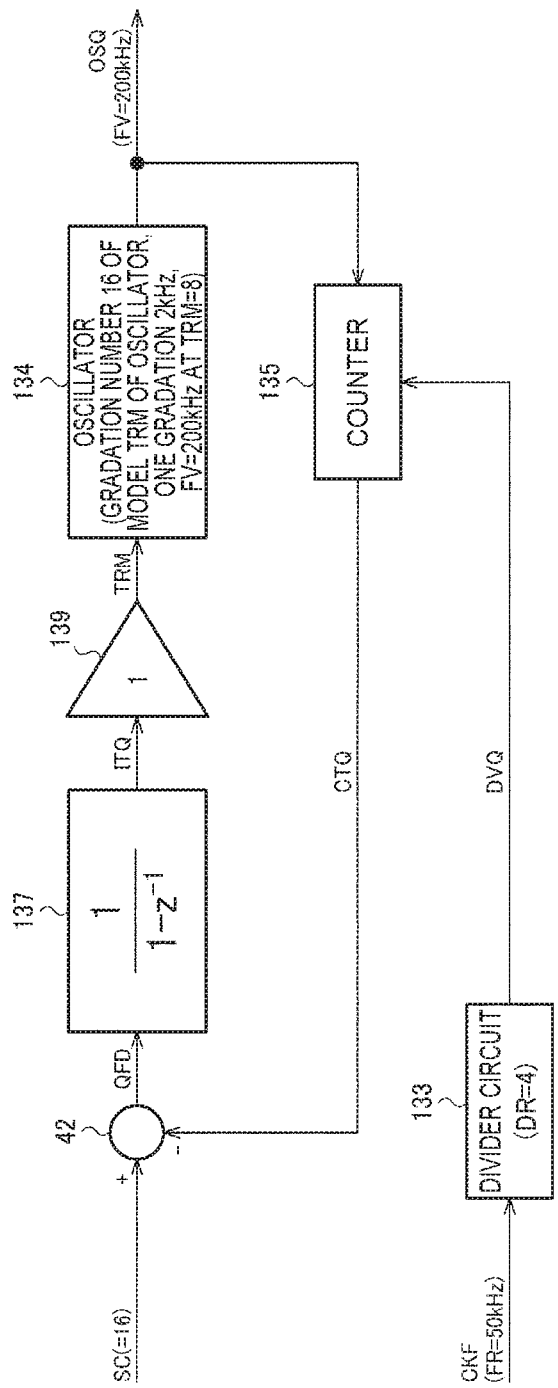
FIG. 7 is a first example of setting parameters of the FLL circuit according to the embodiment.
Figure 8A:
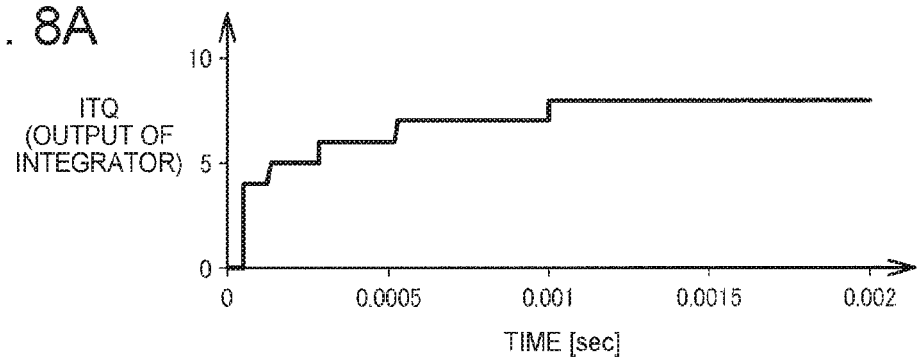
FIGS. 8A to 8D are operation wave examples of the FLL circuit of the first example of the setting parameters.
Figure 8B:
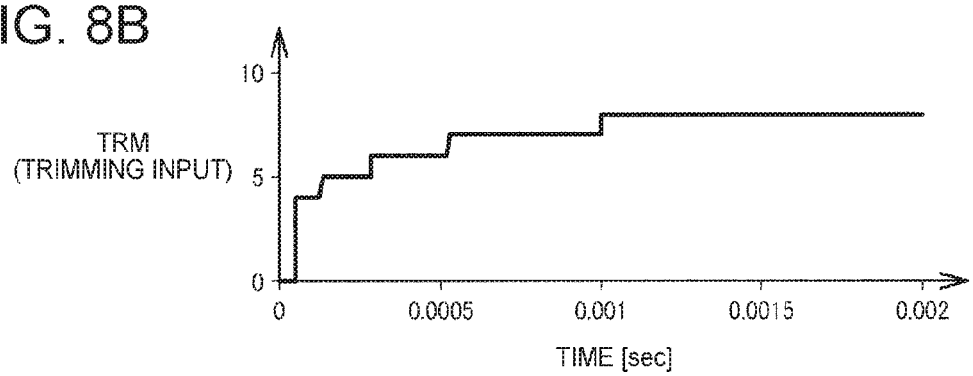
Figure 8C:
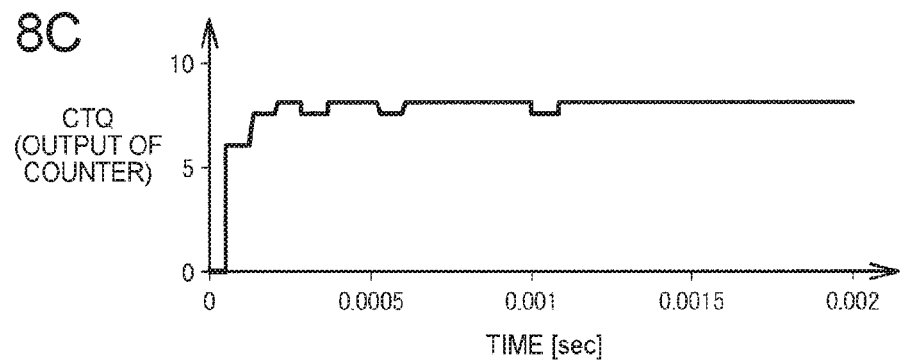
Figure 8D:
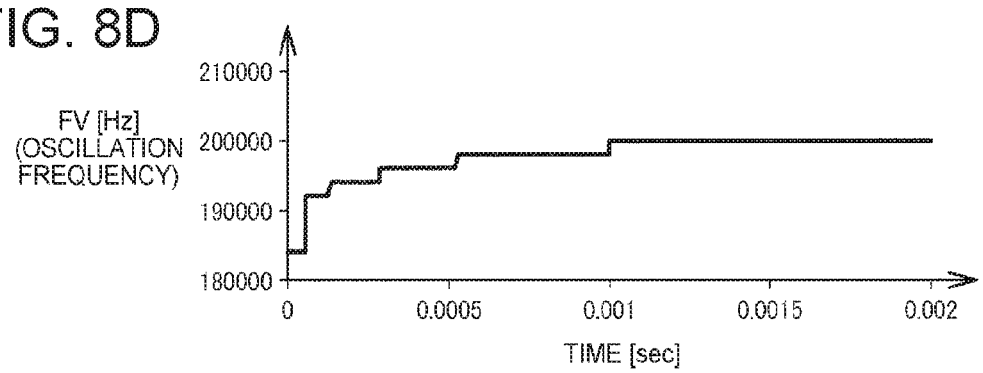
Figure 9:
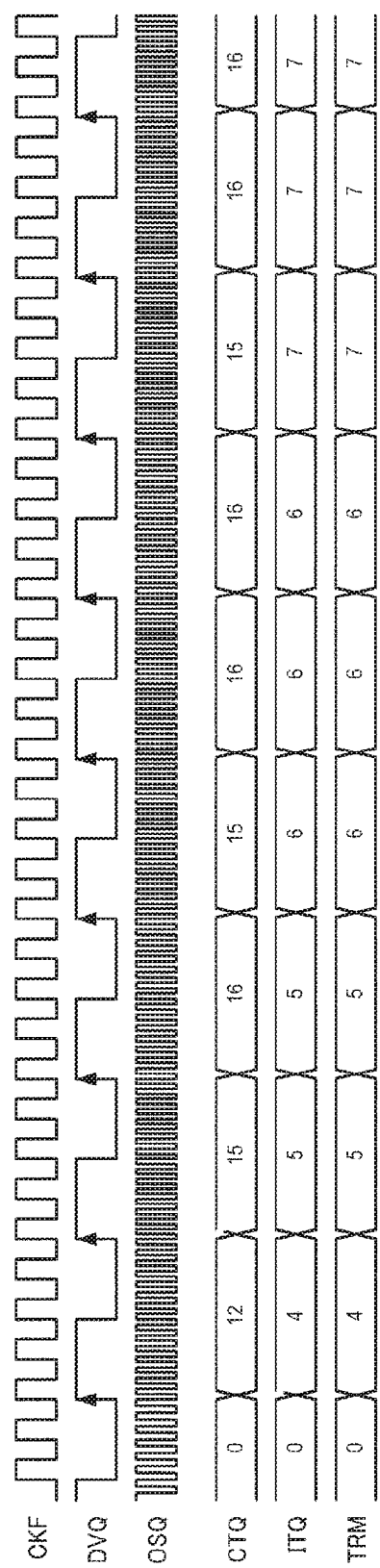
FIG. 9 is an operation wave example of the FLL circuit of the first example of the setting parameters.

FIG. 7 illustrates a first example of setting parameters of the FLL circuit 130, and FIGS. 8A to 9 illustrate examples of operation waveforms in the setting parameters.

As described in FIG. 7, the reference value SC is 16, the gain is 1, the frequency FR of the reference clock signal CKF is 50 kHz, and the division ratio DR is 4. The oscillation frequency setting value TRM is on a 16-gradation scale of 0 to 15, a step of one gradation of the oscillation frequency FV is 2 kHz, and the oscillation frequency FV is 200 kHz when TRM is 8. In this case, DC characteristics satisfy FV=(SC/DR)×FR=200 kHz.

Variation in time series from the start of operation is as follows. As illustrated in FIG. 8A, an initial value of an output (integration value ITQ) of the integrator 137 is, for example, zero. At this time, as illustrated in FIG. 8B, since the oscillation frequency setting value TRM becomes zero, the oscillation frequency FV as illustrated in FIG. 8D starts from 184 kHz. Since the oscillation frequency FV is smaller than 200 kHz of a target, a count value (comparison target value CTQ) becomes smaller than the reference value SC of 16 and the difference value QFD is greater than zero.

Therefore, the integration value ITQ is increased, the oscillation frequency setting value TRM is increased, and the oscillation frequency FV is raised. By repeating this procedure, the oscillation frequency FV reaches 200 kHz that is a target.

FIG. 9 is a timing chart corresponding to the time series variation. As illustrated in FIG. 9, the counter 135 outputs the count value at the rising edge of the divided clock signal DVQ. That is, the counter 135 is reset at the rising edge of the divided clock signal DVQ, counts the clock signal OSQ as a measurement period from the reset timing to the next reset timing, and outputs the counted value as the comparison target value CTQ.

A subtractor 42, the integrator 137, and the gain processing unit 139 are operated by synchronizing at the rising edge of the divided clock signal DVQ. That is, the subtractor 42 outputs the difference value QFD of the reference value SC and the comparison target value CTQ at the rising edge of the divided clock signal DVQ. The delay circuit ($Z^{-1}$) is operated at the rising edge of the divided clock signal DVQ, and the integrator 137 updates the integration value ITQ. The gain processing unit 139 outputs the oscillation frequency setting value TRM at respective rising edges of the divided clock signal DVQ.

The values described in the timing chart of the comparison target value CTQ (count value), the integration value ITQ, and the oscillation frequency setting value TRM correspond to waveforms of FIGS. 8C, 8A, and 8B. It is known to approach the oscillation frequency setting value TRM from a position where TRM is zero that is an initial value to a position where TRM is 8 corresponding to 200 kHz of a target.

Figure 10:
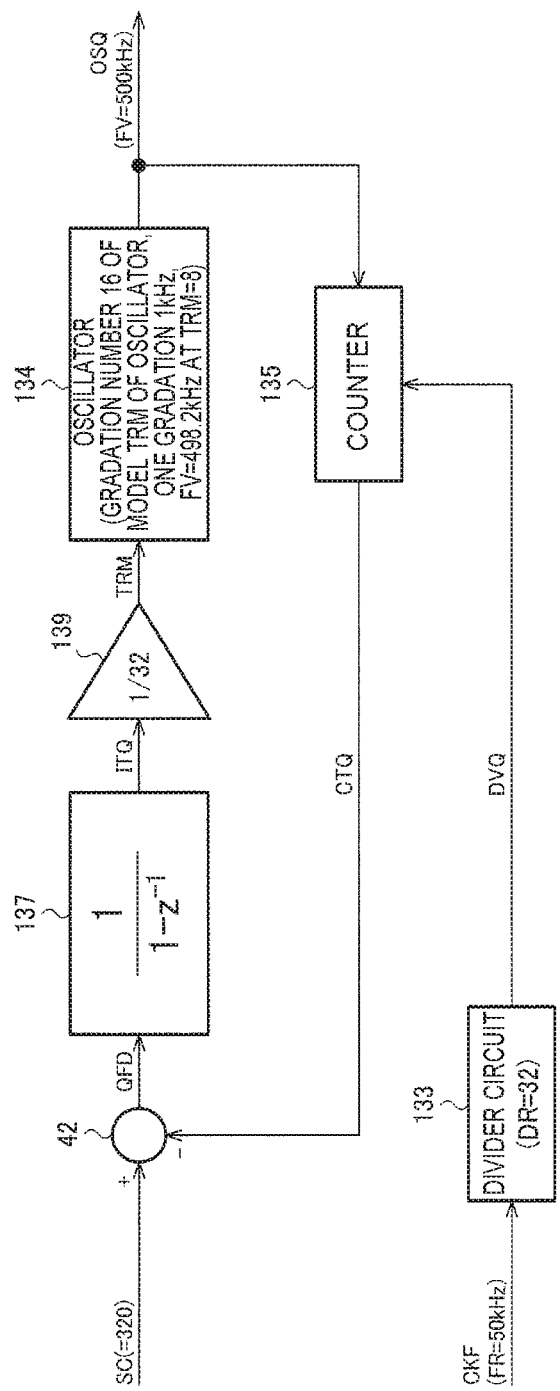
FIG. 10 is a second example of setting parameters of the FLL circuit of the embodiment.
Figure 11A:
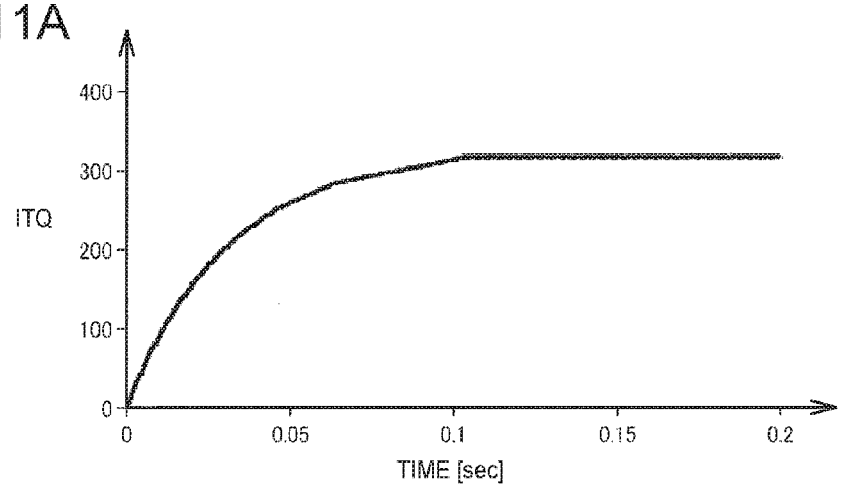
FIGS. 11A to 11C are operation wave examples of the FLL circuit of the second example of the setting parameters.
Figure 11B:
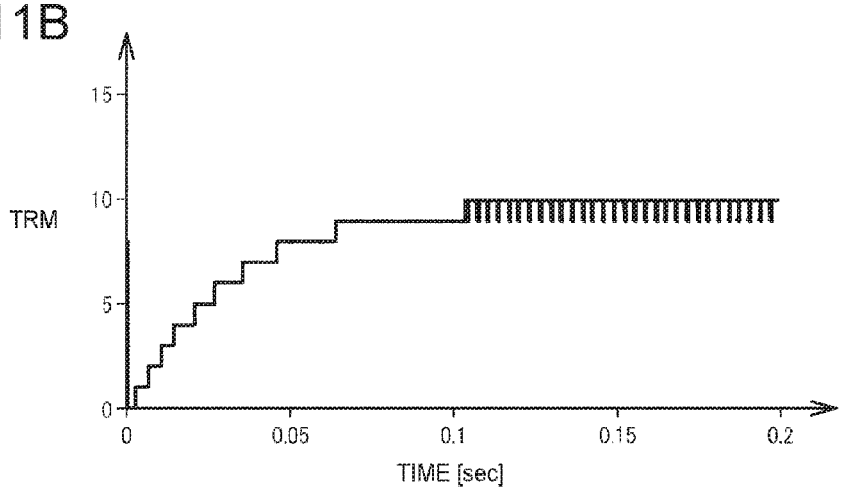
Figure 11C:
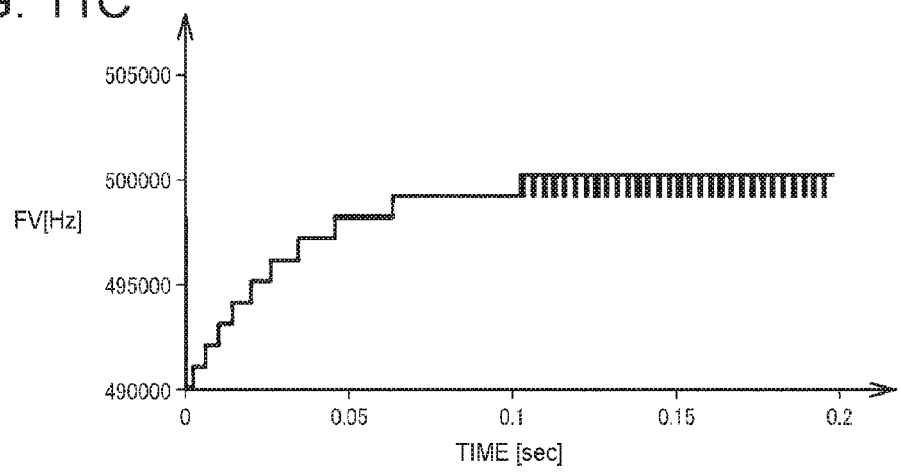

FIG. 10 illustrates a second example of setting parameters of the FLL circuit 130, and FIGS. 11A to 11C illustrate examples of operation waveforms in the setting parameters thereof. The second example is an example of a case where the same frequency as the target is not included in the gradation of the oscillation frequency FV.

As illustrated in FIG. 10, the reference value SC is 320, gain is 1/32, the frequency FR of the reference clock signal CKF is 50 kHz, and the division ratio DR is 32. The oscillation frequency setting value TRM is on a 16-gradation scale of 0 to 15, a step of one gradation of the oscillation frequency FV is 1 kHz, and the oscillation frequency FV is 498.2 kHz, when TRM is 8. In this case, DC characteristics satisfy FV=(SC/DR)×FR=500 kHz.

As illustrated in FIGS. 11A to 11C, the second example is similar to the first example described above in that oscillation frequency FV gradually approaches the target 500 kHz in the time series from the start of operation. In the second example, the oscillation frequency FV is not constant, and is varied by the delta-sigma modulation after the target 500 kHz is approached. That is, since the FV is 499.2 kHz where TRM is 9 and FV is 500.2 kHz where TRM is 10, the TRM alternates between 9 and 10 by the delta-sigma modulation so that the average FV becomes 500 kHz.

Figure 12:
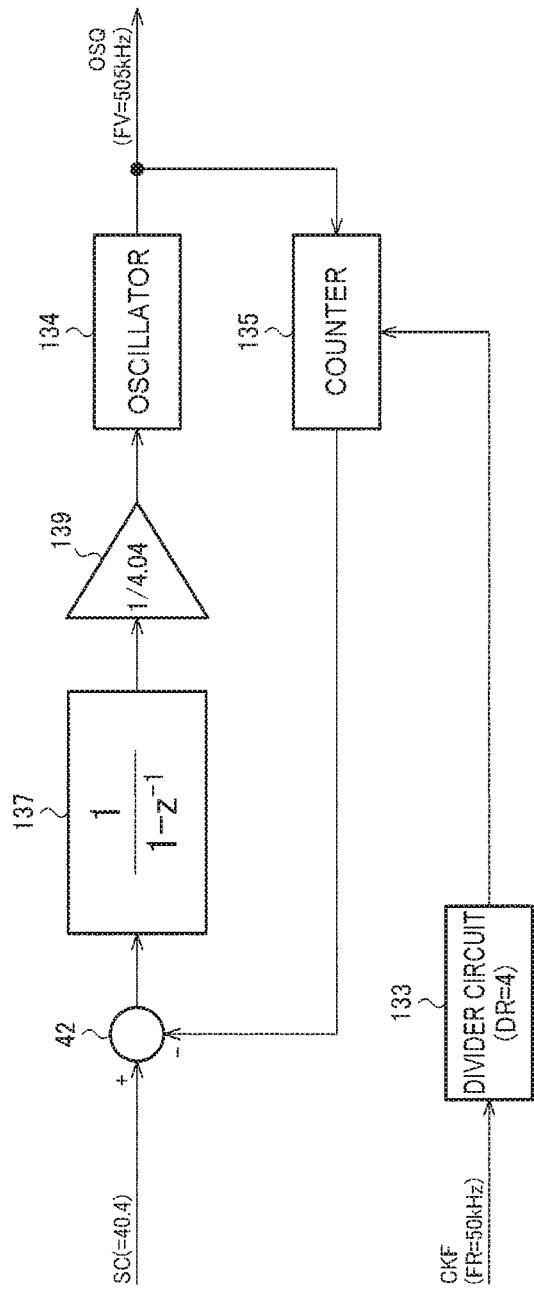
FIG. 12 is a third example of setting parameters of the FLL circuit according to the embodiment.

FIG. 12 illustrates a third example of setting parameters of the FLL circuit 130. The third example is an example of a case where SC/DR is set as a decimal.

As illustrated in FIG. 12, the reference value SC is 40.4, gain is 1/40.4, the frequency FR of the reference clock signal CKF is 50 kHz, and the division ratio DR is 4. A model of the oscillator 134 is the same as that in FIG. 10. The oscillation frequency setting value TRM is on a 16-gradation scale of 0 to 15, a step of one gradation of the oscillation frequency FV is 1 kHz, and the oscillation frequency FV is 503.2 kHz when TRM is 8. In this case, DC characteristics satisfy FV=(SC/DR)×FR=505 kHz.

4. Oscillator

Hereinafter, the oscillator 134 will be described in detail as an example of a case where the oscillator 134 is a CR oscillation circuit.

The CR oscillation circuit of the embodiment includes at least one of a variable capacitance circuit and a variable resistance circuit. Accordingly, the oscillation frequency FV of the CR oscillation circuit is set by setting a capacitance value of the variable capacitance circuit, or a resistance value of the variable resistance circuit, according to the oscillation frequency setting value TRM.

Figure 13:
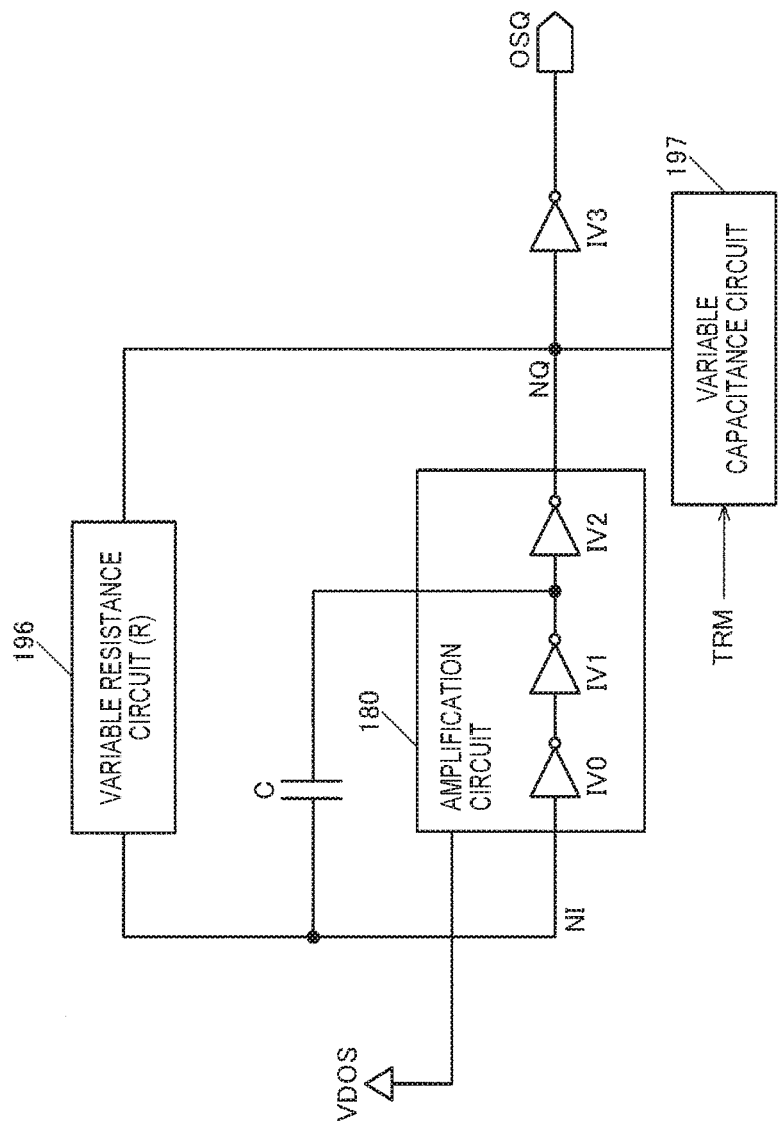
FIG. 13 is an example of a configuration of an oscillator in a case where the oscillator is a CR oscillation circuit.

FIG. 13 illustrates an example of a detailed configuration of the oscillator 134 in this case. The CR oscillation circuit that is the oscillator 134 includes a capacitor C, a variable resistance circuit 196 (first frequency adjusting unit), a variable capacitance circuit 197 (second frequency adjusting unit), and an amplification circuit 180 (buffer circuit).

The CR oscillation circuit is operated by a power supply voltage VDO being supplied, and generates the clock signal OSQ (oscillation signal). Specifically, the CR oscillation circuit feeds back a signal to an input thereof and generates the oscillation signal by using an RC circuit configured by a capacitor and a resistor. Accordingly, a signal obtained through waveform shaping of the generated oscillating signal is output as the clock signal OSQ.

The amplification circuit 180 (inverting amplification circuit) includes inverter circuits IV0, IV1, and IV2. An output of the inverter circuit IV1 is fed back to an input node NI of the amplification circuit 180 through the capacitor C. An output of the inverter circuit IV2 is fed back to the input node NI of the amplification circuit 180 through the variable resistance circuit 196 (R). An input of the inverter circuit IV0 is input to the input of the amplification circuit 180.

The oscillation signal output from the inverter circuit IV2 is processed through waveform shaping by the inverter circuit IV3, and is output as the clock signal OSQ of a square wave. In addition, a divider circuit may be provided in the subsequent stage of the inverter circuit IV3, may output one or a plurality of the clock signals obtained by dividing the clock signal OSQ.

In the example of configuration, the physical quantity transducer 12 and the circuit device 20 are connected to each other, and a capacitance value of the variable capacitance circuit 197 is set based on the oscillation frequency setting value TRM in a state where the FLL circuit 130 is operated. With this, the oscillation frequency of the CR oscillation circuit is controlled by a loop of the FLL circuit 130. The variable capacitance circuit 197 is a circuit capable of adjusting the capacitance value, varies the capacitance value of the RC circuit by varying the capacitance value of the variable capacitance circuit 197, and sets the oscillation frequency of the CR oscillation circuit.

Meanwhile, the oscillation frequency of the CR oscillation circuit is adjusted by the variable resistance circuit 196 before the physical quantity transducer 12 and the circuit device 20 are connected to each other. At this time, the oscillation frequency of the CR oscillation circuit is adjusted to be in the vicinity of a target oscillation frequency (frequency that avoids interference frequency). That is, a resistance value of the variable resistance circuit 196 is adjusted so that the target oscillation frequency (frequency that avoids interference frequency) is within an oscillation frequency range which can be set by the oscillation frequency setting value TRM. The variable resistance circuit 196 is a circuit capable of adjusting the resistance value, varies the resistance value of the RC circuit by varying the resistance value of the variable resistance circuit 196, and sets the oscillation frequency of the CR oscillation circuit.

By doing so, in the embodiment, it is possible to realize adjustment (coarse adjustment) of the oscillation frequency in a state before the physical quantity transducer 12 and the circuit device 20 are connected to each other, and locking (control to constantly maintain ratio of drive frequency and oscillation frequency) of the oscillation frequency by the FLL circuit 130 in a state where the physical quantity transducer 12 and the circuit device 20 are connected to each other. With this, it is possible to generate the clock signal OSQ of a frequency that avoids interference frequency and to reduce the deterioration of detection performance due to the interference described above.

In addition, FIG. 13 illustrates an example of a case where the CR oscillation circuit includes both the variable capacitance circuit 197 and the variable resistance circuit 196, and the capacitance value of the variable capacitance circuit 197 is set according to the oscillation frequency setting value TRM. However, the configuration of the CR oscillation circuit is not limited thereto. For example, the CR oscillation circuit may not include any of the variable capacitance circuit 197 and the variable resistance circuit 196. Alternatively, the oscillation frequency may be controlled by setting a resistance value of the variable resistance circuit 196 according to the oscillation frequency setting value TRM. Alternatively, the oscillation frequency may be controlled by varying the power supply voltage VDOS by a voltage generation circuit (not shown) that is included in the CR oscillation circuit according to the oscillation frequency setting value TRM. Alternatively, the oscillation frequency may be coarsely adjusted by coarsely adjusting the power supply voltage VDOS generated from the voltage generation circuit (not shown) that is included in the CR oscillation circuit.

Figure 14:
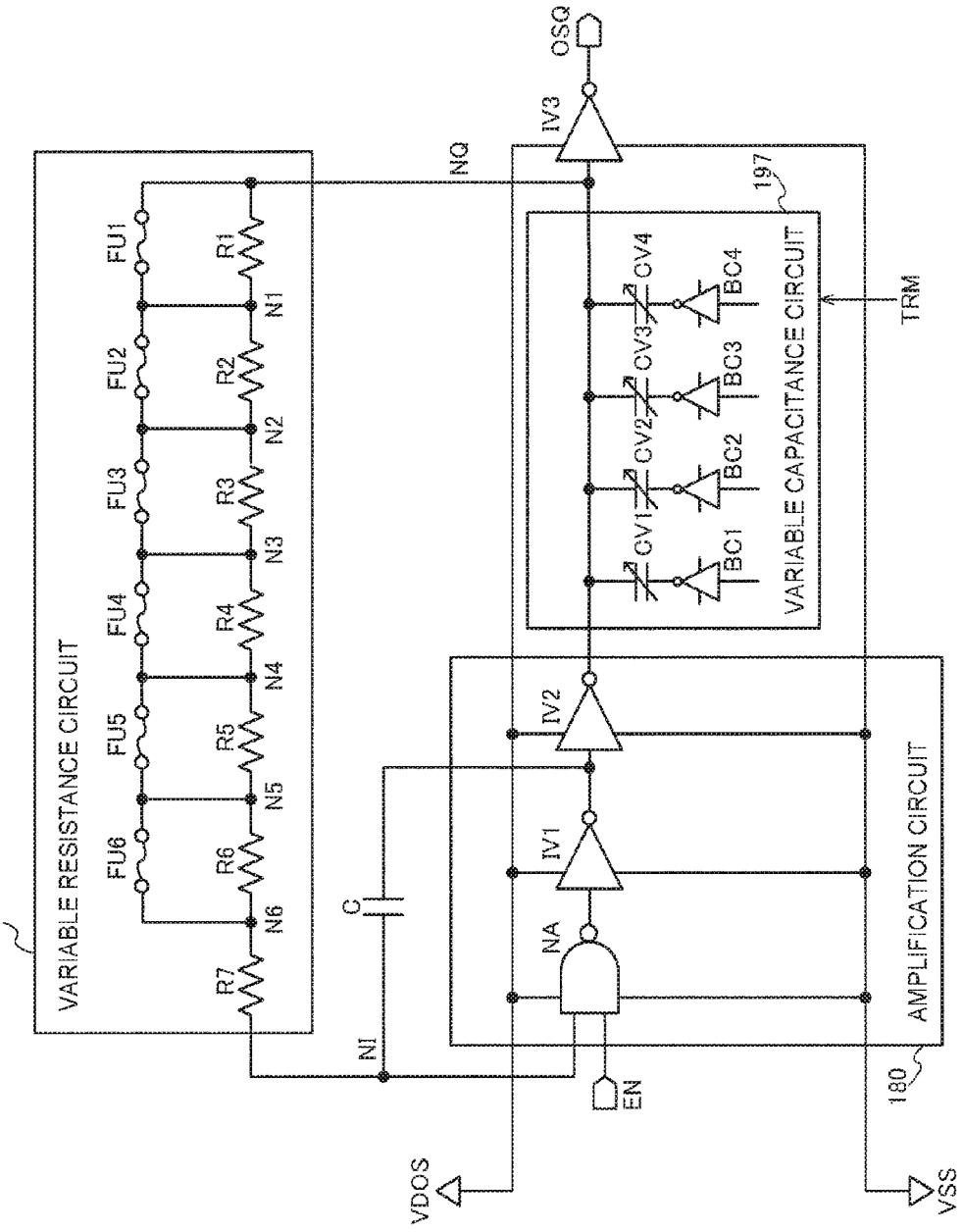
FIG. 14 is an example of a detailed configuration of an amplification circuit, a variable resistance circuit, and a variable capacitance circuit constituting the CR oscillation circuit.

FIG. 14 illustrates an example of a detailed configuration of the amplification circuit 180, the variable resistance circuit 196, and the variable capacitance circuit 197 constituting the CR oscillation circuit.

The amplification circuit 180 includes a NAND circuit NA and inverter circuits IV1 and IV2. An output of the inverter circuit IV1 is fed back to the input node NI of the amplification circuit 180 through the capacitor C. An output of the inverter circuit IV2 is fed back to the input node NI of the amplification circuit 180 through the variable resistance circuit 196. A first input of the NAND circuit NA is input to an input of the amplification circuit 180, and an enable signal EN is input to a second input of the NAND circuit NA. The CR oscillation circuit is set to an operation enabled state when the enable signal EN is an H level, and an operation disabled state when the enable signal EN is an L level.

The variable resistance circuit 196 includes a plurality of resistance elements R1 to R6 connected in series, and a plurality of fuse elements FU1 to FU6 (broadly, switch elements) each of which is connected in parallel with respect to each resistance element of the plurality of resistance elements R1 to R6. For example, the fuse element FU1 is connected in parallel with the resistance element R1, and the fuse element FU2 is connected in parallel with the resistance element R2. A connection configuration of the fuse elements FU3 to FU6 and the resistance elements R3 to R6 is also the same. In addition, the variable resistance circuit 196 includes a reference resistance element R7 that is connected in series to the plurality of resistance elements R1 to R6.

That is, the plurality of resistance elements R1 to R6 and the reference resistance element R7 are connected in series between an output node NQ and the input node NI of the amplification circuit 180.

The variable capacitance circuit 197 includes variable capacitance elements CV1 to CV4 and capacitance control voltage output circuits BC1 to BC4. One end of the variable capacitance elements CV1 to CV4 is connected to the output node NQ of the amplification circuit 180, and the other end thereof is connected to an output of the capacitance control voltage output circuits BC1 to BC4. The variable capacitance elements CV1 to CV4 are components in which capacitance is varied by a capacitance control voltage that is output from the capacitance control voltage output circuits BC1 to BC4. The capacitance control voltage is set to a voltage corresponding to the oscillation frequency setting value TRM. The variable capacitance elements CV1 to CV4, for example, can be realized by a variable capacitor (varactor) or the like. The variable capacitance circuit 197, for example, can be realized by an array of the variable capacitance elements that are weighted in binary. In this case, the control by the capacitance control voltage is high and low level binary control. For example, in a case where the oscillation frequency setting value TRM is four-bit, the capacitance control voltage output circuits BC1 to BC4 output logic levels of the first bit to the fourth bit from the LSB, respectively.

5. Adjustment of Oscillation Frequency Using Variable Resistance Circuit

Next, an adjustment method of the oscillation frequency using the variable resistance circuit 196 will be described. In the adjustment of the oscillation frequency, an advantage of some aspects of the adjustment method is to perform the adjustment to a desired oscillation frequency by using the variable resistance circuit 196 with respect to variation of elements such as transistors and resistors caused by a semiconductor wafer process.

The resistance values of the resistance elements R1 to R6 of the variable resistance circuit 196 of FIG. 14 are weighted, for example, in binary. For example, respective resistance elements R1 to R6 are configured with one or a plurality of resistor units. For example, R1 is configured with resistor units of $2^0=1$, R2 is configured with resistor units of $2^1=2$ connected in series, and R3 is configured with resistor units of $2^2$ connected in series. Similarly, R4, R5, and R6 are configured with resistor units of $2^3$, $2^4$, and $2^5$ connected in series. Accordingly, when a resistance value of the resistor unit is RU, a resistance value of R1 is set to $2^0 \times RU$ (=RU), a resistance value of R2 is set to $2^1 \times RU$ (=2×RU), a resistance value of R3 is set to $2^2 \times RU$, a resistance value of R4 is set to $2^3 \times RU$, a resistance value of R5 is set to $2^4 \times RU$, and a resistance value of R6 is set to $2^5 \times RU$.

Meanwhile, R7 is a reference resistance element for setting an oscillation frequency to be a reference, and RB can be set to, for example, a resistance value of the same degree as R6 when a reference resistance value that is a resistance value of R7 is RB. According to this setting, it is possible to variably set a resistance value of the variable resistance circuit 196 within a predetermined range (for example, range of RB to $RB+RU \times (2^6-1)$).

As illustrated in FIG. 14, the fuse elements FU1 to FU6 are provided in parallel with resistance elements R1 to R6, respectively. Accordingly, the entirety of the fuse elements FU1 to FU6 is in a non-cut out state before fuse cut out. Therefore, a resistance value of the variable resistance circuit 196 is set to the reference resistance value RB (accurately, parasitic resistance value of RB+fuse element or the like) of R7. Accordingly, the oscillation frequency of the CR oscillation circuit is measured in the state. When the measured oscillation frequency is fr, for example, a fuse value is calculated by a trimming equation represented as a linear equation of fr, as represented in the following Equation (1). In the Equation, a and b are integers.

$$\text{Fuse value} = a \times fr + b \quad (1)$$

It is determined which of the fuse elements FU1 to FU6 is cut out (trimming) based on the calculated fuse value. For example, the fuse elements FU1, FU3, FU4, and FU5 are cut out based on a fuse value calculated in the trimming equation. In this case, a resistance value of the variable resistance circuit 196 becomes RB+R1+R3+R4+R5 (+ parasite resistance value).

Specifically, it is possible to determine a fuse element to be cut out by converting a fuse value (fuse value after converting to integer) into data in the binary representation. For example, when a fuse value is $1=2^0$, the fuse element FU1 is cut out, and when a fuse value is $2=2^1$, the fuse element FU2 is cut out. In addition, when a fuse value is $3=2^0+2^1$, the fuse elements FU1 and FU2 are cut out, when a fuse value is $4=2^2$, the fuse element FU3 is cut out, and when a fuse value is $5=2^0+2^2$, the fuse elements FU1 and FU3 are cut out. That is, the fuse element FU1 corresponds to the LSB of the fuse value in the binary representation, the fuse element FU2 corresponds to the following bit of the LSB, and the fuse element FU3 corresponds to the second following bit of the LSB. Similarly, the fuse element FU6 corresponds to the MSB of the fuse value in the binary representation. Therefore, the fuse element FU1 is cut out, when the LSB of a fuse value is 1, and the fuse element FU1 does not cut out, when the LSB is zero. The fuse element FU2 is cut out, when the following bit of the LSB is 1, and the fuse element FU2 does not cut out, when the following bit is zero.

6. Variation Example of Oscillator

As described above, a case where the oscillator 134 is a CR oscillation circuit has been described as an example. However, the oscillator 134 is not limited to a configuration of this case. For example, the oscillator 134 may be a configuration illustrated in FIG. 15.

Figure 15:
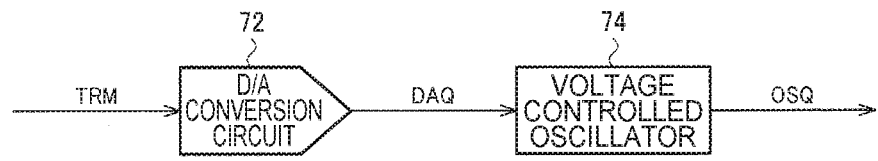
FIG. 15 is a modification example of the configuration of the oscillator.

The oscillator 134 described in FIG. 15 includes a D/A conversion circuit 72 that performs D/A conversion on the oscillation frequency setting value TRM, and a voltage controlled oscillator 74 that oscillates based on an analog output voltage DAQ from the D/A conversion circuit 72. In a case where the oscillator 134 is applied to the FLL circuit 130 of the embodiment, the output voltage DAQ of the D/A conversion circuit 72 is varied according to the oscillation frequency setting value TRM, the frequency of the clock signal OSQ is varied according to the variation, and the frequency is fed back to the oscillation frequency setting value TRM through the frequency comparator 132 and the loop filter 136. The analog output voltage DAQ becomes a discrete voltage value, and the clock signal OSQ that is a desired frequency as an average by the delta-sigma modulation as described in FIG. 5 or the like is output.

7. Modification Example of FLL Circuit

In addition, as described above, a case where the frequency comparator 132 and the loop filter 136 of the FLL circuit 130 are configured as a logic circuit has been described as an example. However, the FLL circuit 130 is not limited to the configuration. For example, as illustrated in FIG. 16, the frequency comparator 132 or the loop filter 136 may be configured as the analog circuit.

Figure 16:
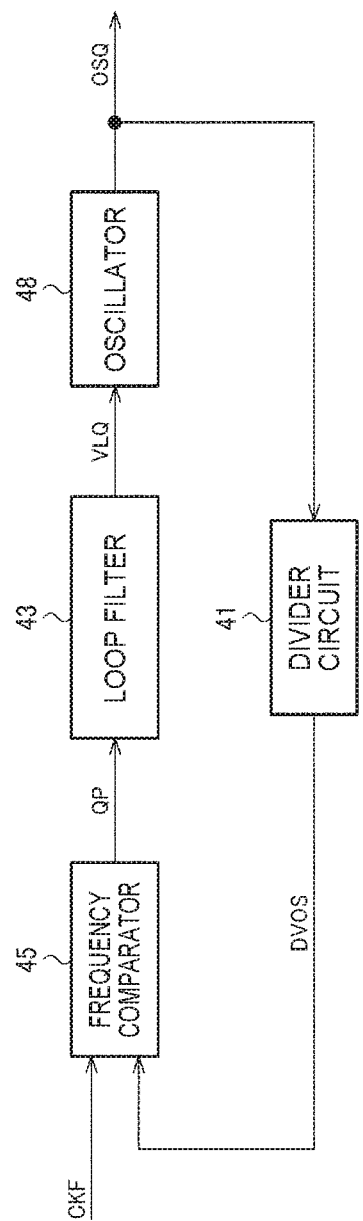
FIG. 16 is a modification example of the configuration of the FLL circuit.

The FLL circuit 130 illustrated in FIG. 16 includes a frequency comparator 45, a loop filter 43, an oscillator 48, and a divider circuit 41.

The divider circuit 41 divides the clock signal OSQ, and outputs the divided clock signal DVOS. The frequency comparator 45 compares the frequency of the reference clock signal CKF and the frequency of the divided clock signal DVOS, and outputs an analog signal QP based on the compared difference. For example, the frequency comparator 45 is realized as a charge pump circuit. The loop filter 43 performs low pass filter processing on the analog signal QP, and outputs a voltage obtained through the processing as a control voltage VLQ. For example, the loop filter 136 is realized as a passive low pass filter configured by a capacitor or a resistor. The oscillator 48 oscillates at a frequency corresponding to the control voltage VLQ, and outputs the clock signal OSQ. For example, the oscillator 48 is realized as the voltage controlled oscillator (VCO).

8. Calculation Processing Unit

According to the FLL circuit 130 described above, it is possible to operate the A/D conversion circuit 100 or the DSP unit 110 by a clock signal OSQ (or operation clock signal divided from reference clock signal) SC/DR times the reference clock signal CKF from the drive circuit 30.

At this time, since the drive frequency of the physical quantity transducer 12 is varied by manufacturing variations or the like, the frequency of the clock signal OSQ is varied in accordance with the variation of the frequency. For example, angle information in the gyro sensor is obtained by integrating the angular velocity information. However, there is a possibility that the integration period is varied by varying the operation frequency of the DSP unit 110 and the like, and an error is generated in the angular velocity information.

Therefore, in the embodiment, it is possible to obtain more accurate angular velocity information by performing the following processing in a calculation processing unit 150 provided in the subsequent stage of the detection circuit 60. In addition, the calculation processing unit 150 may be included in the DSP unit 110 of the detection circuit 60.

Figure 17:
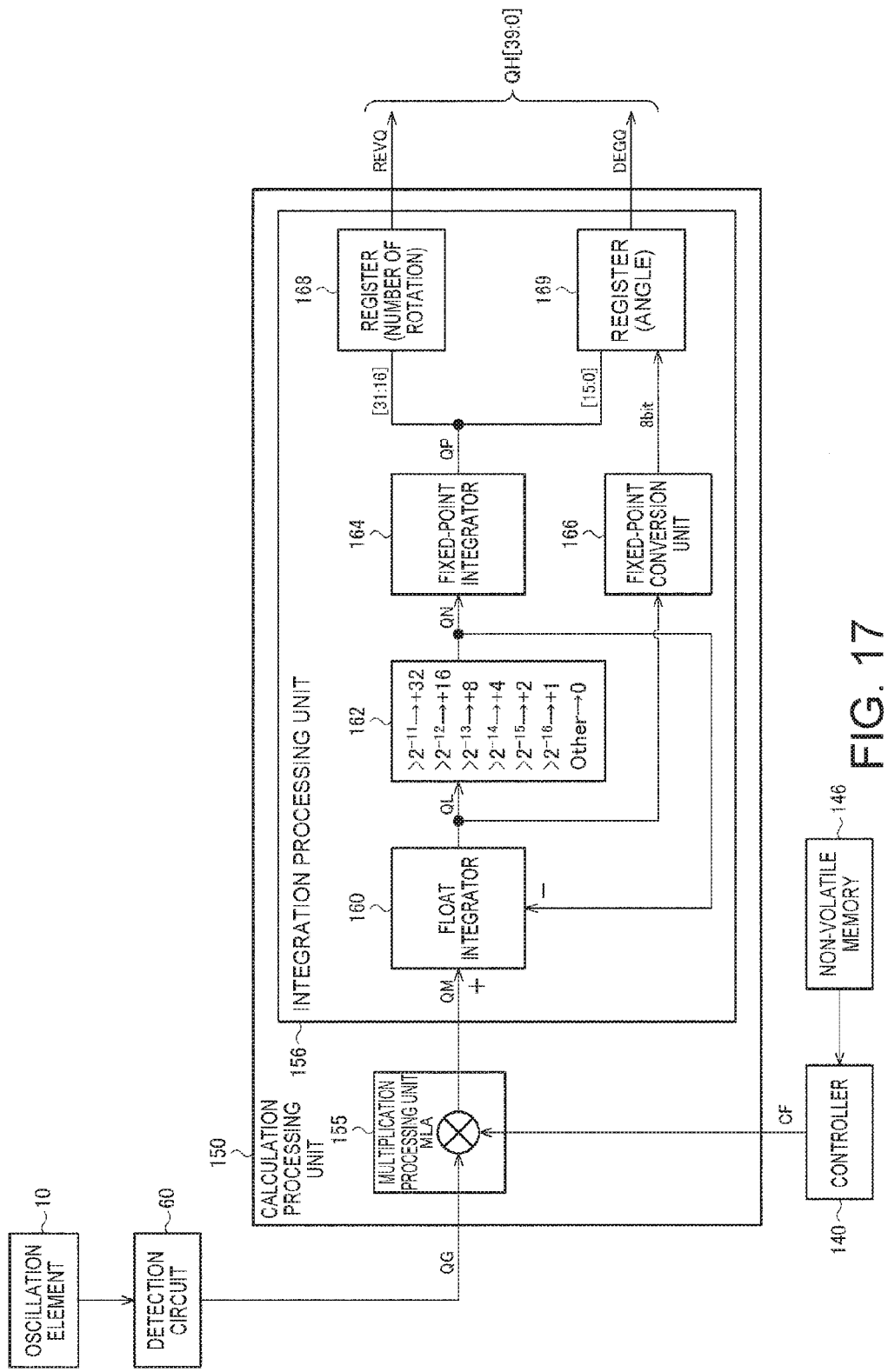
FIG. 17 is an example of a configuration of a calculation processing unit.

FIG. 17 illustrates an example of a configuration of the calculation processing unit 150. The calculation processing unit 150 includes a multiplication processing unit 155 and an integration processing unit 156, is operated (that is, operated by operation clock signal of frequency represented as (SC/DR)×FR/DO, using a reference clock frequency FR) at an operation clock signal in which the clock signal OSQ is divided by DO. The multiplication processing unit 155 performs multiplication processing based on angular velocity information QG (physical quantity information) from the detection circuit 60 and a calculation coefficient CF (broadly, drive frequency information) where a value is set based on the drive frequency of the drive circuit 30. The integration processing unit 156 receives a multiplied result QM (for example, angle displacement) from the multiplication processing unit 155, and performs the integration processing with respect to the multiplied result QM. With this, the integration processing of the angular velocity information QG is realized. Accordingly, the integration processing unit 156 outputs rotation number information QH. The rotation number information QH includes an integral part REVQ and a fractional part DEGQ as fixed-point representation.

The calculation coefficient CF is a coefficient in which a value is set based on the drive frequency of the drive circuit 30 as described below. More specifically, the calculation coefficient CF is a coefficient in which a value is set based on setting sensitivity of the drive frequency and the angular velocity information. Calculation processing based on time interval information defined by the drive frequency of the drive circuit 30 is realized by performing processing that multiplies the calculation coefficient CF by the angular velocity information QG by the multiplication processing unit 155.

More specifically, the multiplication processing unit 155 includes a multiplier MLA. The multiplication processing unit 155 performs processing that multiplies the calculation coefficient CF (integer) by the angular velocity information QG (gyro signal). With this, an angle displacement ($\Delta\theta$) is calculated at a time interval of a data rate. The angle displacement is obtained by multiplication processing on the angular velocity and the time interval. Accordingly, the time interval is set by the calculation coefficient CF.

The calculation coefficient CF input to the multiplication processing unit 155, for example, is represented as the following Equation (2).

$$CF=1/(360\times SEN \times fxt \times (SC/DR)/DO) \tag{2}$$

In the above Equation (2), SEN represents a setting sensitivity (LSB/dps), and fxt represents the drive frequency (Hz) of the oscillation element 10 (crystal oscillation element). Specifically, the setting sensitivity SEN is a sensitivity of angular velocity set as a specification (design value) of the physical quantity detection apparatus (gyro sensor). That is, the setting sensitivity SEN is uniquely determined as product specifications, for example, so as to satisfy SEN=300 (LSB/dps). In addition, fxt is a drive frequency that is measured in a state where the circuit device 20 and the oscillation element 10 are connected by using the drive signal (or signal based on drive signal) of the oscillation element 10 as a reference clock signal. That is, fxt is set based on the measured result of the drive frequency. In addition, the multiplication coefficient CF is not limited to the above Equation (2). For example, it is possible to implement various modification examples such as a coefficient obtained by multiplying the above Equation (2) by a predetermined integer.

In the embodiment, calculation processing (multiplication processing) of the calculation processing unit 150 is performed by using a calculation coefficient CF in which a value is set based on the drive frequency (fxt) of the drive circuit 30 and the setting sensitivity (SEN) of the angular velocity (physical quantity information). Accordingly, the drive frequency (fxt) used in the setting of the calculation coefficient CF is set based on the measured result of the drive frequency. Specifically, in the embodiment, the calculation coefficient CF of the above Equation (2) is written in a non-volatile memory 146 as the drive frequency information (information in which value based on drive frequency is set). Accordingly, the calculation processing unit 150 reads the calculation coefficient CF as the drive frequency information from the non-volatile memory 146, and performs calculation processing based on the time interval information defined by the drive frequency information.

Variations are generated with respect to a design value in the drive frequency of the drive circuit 30. For example, variations are generated with respect to the design value (50 kHz to 200 kHz) of the drive frequency. Accordingly, in the embodiment, since the time interval information is defined by the drive frequency in the calculation processing of the calculation processing unit 150, when there are the variations in the drive frequency, the variations are also generated in the calculation result. For example, a rotation angle that is the operation result of the calculation processing unit 150 is not in 10°, and the angle is varied from 10°, when there is a variation in the drive frequency, while the detection target is rotated by 10° in actuality.

In this respect, in the embodiment, the drive frequency is measured in a state where the oscillation element 10 and the circuit device are connected to each other, the calculation coefficient CF (broadly, drive frequency information) is obtained based on the measured drive frequency (fxt) as illustrated in the above Equation (2), and the calculation coefficient CF is stored in the non-volatile memory 146. Accordingly, the calculation processing unit 150 performs calculation processing based on the calculation coefficient CF that is read from the non-volatile memory 146. Accordingly, since the time interval information used in the calculation processing is defined based on the measured drive frequency (fxt), the calculation processing unit 150 can output more accurate calculation result, even in a case where there is a variation in the drive frequency.

In addition, sensitivity correction is performed by the DSP unit 110 with respect to an angular velocity detected by the detection circuit 60, and sensitivity of the angular velocity is corrected so as to be a setting sensitivity that is a design value. Values of the setting sensitivity may be different according to the product of the physical quantity detection apparatus, and a correct calculation result cannot be obtained when the calculation processing unit 150 performs calculation processing such as integration processing without considering the setting sensitivity.

In this respect, in the embodiment, as illustrated in the above Equation (2), the calculation coefficient CF is obtained based on the setting sensitivity SEN, and the calculation processing unit 150 performs calculation processing based on the calculation coefficient CF. Accordingly, it is possible to perform calculation processing by the calculation coefficient CF in accordance with the angular velocity sensitivity output from the detection circuit 60. For example, in a case where the setting sensitivity SEN is 300 (LSB/dps), the angular velocity sensitivity output from the detection circuit 60 is also set to 300 (LSB/dps). In addition, it is possible to obtain an accurate calculation result that is independent of the sensitivity by multiplying the calculation coefficient CF in which the setting sensitivity SEN is set as the denominator, as the above Equation (2), by the angular velocity from the detection circuit 60.

The integration processing unit 156 includes a float integrator 160 (floating-point integrator) and a fixed-point integrator 164 (fixed-point decimal integrator). In addition, the integration processing unit 156 may include a detector 162, a fixed-point conversion unit 166, and registers 168 and 169.

The float integrator 160 integrates an angle displacement ($\Delta\theta = \omega \times t$) in a floating-point format, and calculates an angle. Here, it is preferable that an output value of the float integrator 160 is always a small value (for example, equal to or smaller than $2^{-16}$) so as to perform the integration without lowering the accuracy of floating-point number calculation. Therefore, when an output value of the float integrator 160 exceeds a constant value, processing for subtracting the exceeded amount is performed. For example, when the detector 162 determines that the output value of the float integrator 160 exceeds, for example, $2^{-16}$, processing is performed which subtracts the amount of subtraction of the magnitude of, for example, "+1" from the integration result (output value), and processing is performed which adds the amount of addition "+1" corresponding to the amount of subtraction to another fixed-point integrator 164. Conversion for a fixed-point number is also performed at this timing. Similarly, when it is determined that the output value of the float integrator 160 exceeds, for example, $2^{-15}$, processing is performed which subtracts the amount of subtraction of the magnitude of, for example, "+2" from the integration result, and processing is performed which adds the amount of addition "+2" corresponding to the amount of subtraction to the fixed-point integrator 164. The amount of subtraction and the amount of addition become "+4", "+8", "+16", and "+32" in a case where the output value exceeds $2^{-14}$, $2^{-13}$, $2^{-12}$, and $2^{-11}$, respectively.

Accordingly, the output or the like of the fixed-point integrator 164 is output as the integral part REVQ and the fractional part DEGQ of the rotation number information through the register 168 and the register 169.

In addition, in FIG. 17, for the small angle component (lower eight bits), the output of the float integrator 160 of the floating-point representation is directly converted without going through the fixed-point integrator 164. For example, in a case where a value represented by an exponential expression of the floating-point number is $2^{-15}$, conversion to a fixed-point number is performed by setting the eighth bit as 1, and outputting the upper seven bits of the mantissa of a floating-point number as the lower seven bits. This conversion is performed by the fixed-point conversion unit 166, and the obtained fixed-point of eight bits is output to the register 169. Similarly, in a case where a value represented by an exponential expression of the floating-point number is $2^{-14}$, conversion to a fixed-point number is performed by respectively setting the eighth bit and the seventh bit as 0 and 1 and outputting the upper six bits of the mantissa of a floating-point number as the lower six bits.

As described above in FIG. 17, the calculation processing unit 150 outputs rotation number information QH (physical quantity information after calculation) of the fixed-point representation by performing calculation processing with respect to the angular velocity information QG (physical quantity information) of the floating-point representation. The rotation number information QH (angle information) of the fixed-point representation is configured by the integral part REVQ and the fractional part DEGQ.

9. Detailed Configuration of Electronic Apparatus, Gyro Sensor, and Circuit Device FIG. 18 illustrates an example of a detailed configuration of the circuit device 20 of the embodiment, a gyro sensor 510 (broadly, physical quantity detection apparatus) including the circuit device 20, and an electronic apparatus 500 including the gyro sensor 510.

In addition, without limiting the circuit device 20, the electronic apparatus 500, and the gyro sensor 510 to the configuration in FIG. 18, various modification examples such as the omission of part of the components thereof or the addition of other elements can be implemented. In addition, it is possible for the electronic apparatus 500 of the embodiment to assume the form of various apparatuses such as digital cameras, video cameras, smart phones, mobile phones, vehicle navigation systems, robotics, biological information detection apparatuses, game machines, watches, health appliances, portable information terminals, and the like. In addition, hereinafter, a case where the physical quantity transducer (angular velocity sensor element) is a piezoelectric type oscillation element (oscillation gyro), and the sensor is the gyro sensor is described as an example. However, the invention is not limited thereto. For example, it is possible to apply the invention to an oscillation gyro of an electrostatic capacitance detection method formed on a silicon substrate or the like, a physical quantity transducer for detecting physical quantity equivalent to the angular velocity information or physical quantity other than the angular velocity information, or the like.

The electronic apparatus 500 includes the gyro sensor 510 and a processing unit 520. In addition, it is possible for the electronic apparatus 500 to include a memory 530, an operation unit 540, and a display unit 550. The processing unit 520 (external processing device) realized by CPU, MPU, or the like performs control of the gyro sensor 510, or the like or whole control of the electronic apparatus 500. In addition, the processing unit 520 performs processing based on the angular velocity information (broadly, physical quantity) detected by the gyro sensor 510. For example, processing for image stabilization, posture control, GPS autonomous navigation, or the like is performed based on the angular velocity information. The memory 530 (ROM, RAM, or the like) stores control programs or various data and functions as a work area or a data storage area. The operation unit 540 is to operate the electronic apparatus 500 by a user, and the display unit 550 displays a variety of information to the user.

The gyro sensor 510 (physical quantity detection apparatus) includes the oscillation element 10 and the circuit device 20. The oscillation element 10 (broadly, physical quantity transducer or angular velocity sensor element) is a piezoelectric type oscillation element formed from a thin plate of a piezoelectric material such as crystal. Specifically, the oscillation element 10 is a double T-shaped oscillation element formed by a Z-cut crystal substrate.

The circuit device 20 includes the drive circuit 30, the FLL circuit 130, the detection circuit 60, a controller 140, a register unit 142, an output unit 144 (interface unit), a non-volatile memory 146, and a calculation processing unit 150. In addition, various modification examples such as the omission of part of the components or the addition of other elements can be implemented.

The FLL circuit 130 generates a clock signal based on a signal from the drive circuit 30. The detection circuit 60 includes the A/D conversion circuit 100 and the DSP unit 110. The A/D conversion circuit 100, the DSP unit 110, the calculation processing unit 150, and the controller 140 are operated by the clock signal from the FLL circuit 130 or the divided clock signal of the clock signal.

The controller 140 performs control processing of the circuit device 20. The controller 140 can be realized by a logic circuit (gate array or the like), a processor, or the like. Various types of switch control, mode setting, or the like in the circuit device 20 is performed by the controller 140.

The drive circuit 30 drives the oscillation element 10 by outputting the drive signal DQ. For example, a feedback signal DI is received from the oscillation element 10, the drive signal DQ corresponding to the received signal is output, and the oscillation element 10 is excited. The detection circuit 60 receives the detection signals IQ1 and IQ2 (detection current and charge) from the oscillation element 10 driven by the drive signal DQ, and detects (extract) a desired signal (Coriolis force signal), from the detection signals IQ1 and IQ2, corresponding to the physical quantity applied to the oscillation element 10.

The oscillation element 10 includes a base 1, connection arms 2 and 3, drive arms 4, 5, 6, and 7, and detection arms 8 and 9. The detection arms 8 and 9 are extended in the +Y axis direction and the −Y axis direction with respect to the base 1 of a rectangular shape. In addition, the connection arms 2 and 3 are extended in the −X axis direction and the +X axis direction with respect to the base 1. The drive arms 4 and 5 are extended in the +Y axis direction and the −Y axis direction with respect to the connection arm 2, and the drive arms 6 and 7 are extended in the +Y axis direction and the −Y axis direction with respect to the connection arm 3. In addition, X axis, Y axis, and Z axis represent the axes of crystal, and are referred to as an electric axis, a mechanical axis, and an optical axis, respectively.

The drive signal DQ from the drive circuit 30 is input to a drive electrode provided on an upper surface of the drive arms 4 and 5, and a drive electrode provided on a side surface of the drive arms 6 and 7. In addition, signals from a drive electrode provided on a side surface of the drive arms 4 and 5, and a drive electrode provided on an upper surface of the drive arms 6 and 7 are input to the drive circuit 30 as a feedback signal DI. In addition, signals from a detection electrode provided on an upper surface of the detection arms 8 and 9 are input to the detection circuit 60 as the detection signals IQ1 and IQ2. In addition, a common electrode provided on a side surface of the detection arms 8 and 9 is, for example, grounded.

When AC drive signal DQ is applied by the drive circuit 30, bending vibration (vibration excitation) as illustrated by an arrow A is caused in the drive arms 4, 5, 6, and 7 by inverse piezoelectric effect. That is, the bending vibration is performed in which the tip parts of the drive arms 4 and 6 repeatedly perform approach toward and separation from each other, and the tip parts of the drive arms 5 and 7 repeatedly perform approach toward and separation from each other. At this time, since line symmetrical vibration is performed in the drive arms 4 and 5 and the drive arms 6 and 7 with respect to the Y axis that passes through a position of the center of gravity of the base 1, the base 1, the connection arms 2 and 3, and the detection arms 8 and 9 are hardly vibrated.

In this state, when angular velocity of the Z axis as a rotation axis is applied with respect to the oscillation element 10 (when oscillation element 10 is rotated around Z axis), the drive arms 4, 5, 6, and 7 are vibrated as illustrated by an arrow B by a Coriolis force. That is, the Coriolis force in the arrow B direction orthogonal to the arrow A direction and the Z axis direction acts on the drive arms 4, 5, 6, and 7, and thereby a vibration component is generated in the arrow B direction. Vibration of the arrow B is transmitted to the base 1 through the connection arms 2 and 3, and the bending vibration is generated to the detection arms 8 and 9 in the arrow C direction. A charge signal generated by a piezoelectric effect caused by the bending vibration of the detection arms 8 and 9 is input to the detection circuit 60 as the detection signals IQ1 and IQ2. Here, the vibration of the arrow B of the drive arms 4, 5, 6, and 7 is generated in the circumferential direction with respect to the position of the center of gravity of the base 1, and the vibration of the detection arms 8 and 9 is generated in the arrow C direction, opposite to the arrow B direction which is the circumferential direction. The detection signals IQ1 and IQ2 are signals in which a phase is deviated by 90° with respect to the drive signal DQ.

For example, when angular velocity of the oscillation element 10 (gyro sensor) around the Z axis is ω, mass is m, and vibration speed is v, the Coriolis force is represented as Fc=2m·v·ω. Accordingly, it is possible for the detection circuit 60 to obtain an angular velocity ω by detecting a desired signal that is a signal corresponding to the Coriolis force. Therefore, it is possible for the processing unit 520 to perform a variety of processing such as image stabilization, posture control, GPS autonomous navigation, or the like, by using the obtained angular velocity ω.

In addition, FIG. 18 illustrates an example of a case where the shape of the oscillation element 10 is a double T shape.

However, the oscillation element 10 of the embodiment is not limited to a configuration of this case. For example, the oscillation element may be the shape of a tuning fork, an H shape, or the like. In addition, the piezoelectric material of the oscillation element 10 may be a material of ceramics, silicon, or the like other than the crystal.

Figure 19:
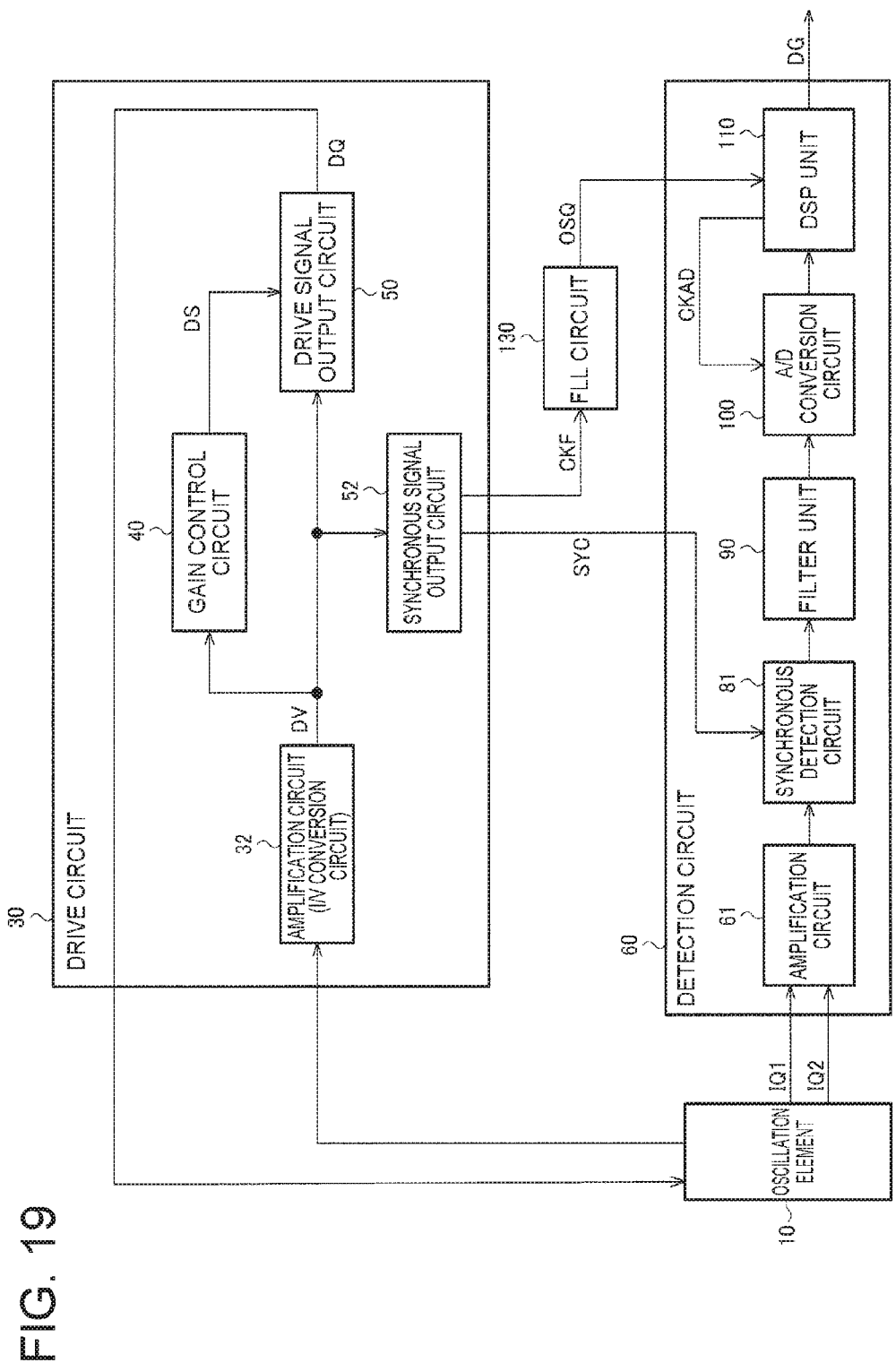
FIG. 19 is an example of a detailed configuration of a drive circuit and a detection circuit.

FIG. 19 illustrates an example of a detailed configuration of the drive circuit 30 and the detection circuit 60 of the circuit device.

The drive circuit 30 includes an amplification circuit 32 that receives a feedback signal DI from the oscillation element 10, again control circuit 40 that performs automatic gain control, and a drive signal output circuit 50 that outputs a drive signal DQ to the oscillation element 10. In addition, the drive circuit 30 includes a synchronous signal output circuit 52 that outputs a synchronous signal SYC to the detection circuit 60. In addition, the configuration of the drive circuit 30 is not limited to FIG. 19, and various modification examples such as the omission of part of the components or the addition of other elements can be implemented.

The amplification circuit 32 (I/V conversion circuit) amplifies the feedback signal DI from the oscillation element 10. For example, the amplification circuit 32 outputs a signal by converting a signal DI of a current from the oscillation element 10 into a signal DV of a voltage. The amplification circuit 32 can be realized by an operational amplifier, a feedback resistance element, a feedback capacitor, or the like.

The drive signal output circuit 50 outputs the drive signal DQ based on a signal DV amplified by the amplification circuit 32. For example, the drive signal output circuit 50 can be realized by a computer or the like, in a case where the drive signal output circuit 50 outputs a drive signal of a rectangular wave (or sine wave).

The gain control circuit 40 (AGC) outputs the control voltage DS to the drive signal output circuit 50, and controls the amplitude of the drive signal DQ. Specifically, the gain control circuit 40 monitors the signal DV, and controls the gain of an oscillation loop. For example, it is necessary to constantly maintain the amplitude of a drive voltage supplied to the oscillation element 10 (oscillation element for driving) so as to constantly maintain the sensitivity of the gyro sensor in the drive circuit 30. Therefore, the gain control circuit 40 for automatically adjusting the gain is provided in an oscillation loop of the drive oscillation systems. The gain control circuit 40 variably performs automatic adjustment on the gain so as to constantly maintain the amplitude (oscillation speed v of oscillation element) of a feedback signal DI from the oscillation element 10. The gain control circuit 40 can be realized by a full-wave rectifier that performs full-wave rectification on an output signal DV of the amplification circuit 32, an integrator that performs integration processing on the output signal of the full-wave rectifier, or the like.

The synchronous signal output circuit 52 receives the signal DV amplified by the amplification circuit 32, and outputs the synchronous signal SYC (reference signal) to the detection circuit 60. The synchronous signal output circuit 52 is realized by a comparator that generates the synchronous signal SYC of a rectangular wave by performing binarization processing for the signal DV of a sine wave (AC), a phase adjustment circuit (phase shifter) that performs phase adjustment on the synchronizing signal SYC, or the like.

In addition, the synchronous signal output circuit 52 outputs the reference clock signal CKF to the FLL circuit 130. For example, the synchronous signal output circuit 52 includes a comparator that performs binarization processing on the signal DV of the sine wave. Accordingly, for example, a signal in which an output signal of the comparator is buffered by a first buffer circuit becomes the synchronous signal SYC, and a signal in which the output signal of the comparator is buffered by a second buffer circuit becomes the reference clock signal CKF. With this, the reference clock signal CKF and the synchronous signal become, for example, signals with the same frequency. In addition, a first comparator for generating the synchronous signal SYC and a second comparator for generating the reference clock signal CKF may be provided.

The detection circuit 60 includes the amplification circuit 61, the synchronous detection circuit 81, the filter unit 90, the A/D conversion circuit 100, and the DSP unit 110. The amplification circuit 61 receives first and second detection signals IQ1 and IQ2 from the oscillation element 10, and performs charge-voltage conversion, differential signal amplification, gain adjustment, or the like. The synchronous detection circuit 81 performs synchronous detection based on the synchronous signal SYC from the drive circuit 30. The filter unit 90 (low pass filter) functions as a prelude filter of the A/D conversion circuit 100. In addition, the filter unit 90 also functions as a circuit that attenuates unwanted signals that cannot be removed by synchronous detection. The A/D conversion circuit 100 performs A/D conversion on signals after the synchronous detection. The DSP unit 110 performs digital signal processing such as digital filter processing, digital correction processing, or the like with respect to digital signals from the A/D conversion circuit 100. For example, there is zero point correction processing, sensitivity correction processing, or the like, as the digital correction processing.

In addition, for example, a phase of the detection signals IQ1 and IQ2 that are charge signals (current signal) from the oscillation element 10 is delayed by 90° with respect to the drive signal DQ that is a voltage signal. In addition, a phase is delayed by 90° in a Q/V conversion circuit, or the like of the amplification circuit 61. Therefore, a phase of an output signal of the amplification circuit 61 is delayed by 180° with respect to the drive signal DQ. Accordingly, for example, it is possible to remove an unwanted signal, or the like with a phase delayed by 90° with respect to the drive signal DQ by performing synchronous detection using the synchronous signal SYC of the same phase with the drive signal DQ (DV).

10. Moving Object and Electronic Apparatus

FIG. 20A illustrates an example of the moving object including the circuit device 20 of the embodiment. The circuit device 20 of the embodiment, for example, can be incorporated in various moving objects such as vehicles, airplanes, motorcycles, bicycles, vessels, or the like. The moving object is equipment or an apparatus that moves on the ground, in the sky, or the sea by mounting thereon, for example, a drive mechanism such as an engine, a motor, or the like, a steering mechanism such as a steering wheel, a rudder, or the like, and various electronic apparatuses. FIG. 20A schematically illustrates a vehicle 206 as a specific example of the moving object. The vehicle 206 is incorporated with the gyro sensor 510 (sensor) including the oscillation element 10 and the circuit device 20. The gyro sensor 510 can detect the posture of a vehicle body 207. The detection signal of the gyro sensor 510 is supplied to a vehicle body posture control apparatus 208. The vehicle body posture control apparatus 208 may control, for example, the hardness of the suspension according to the posture of the vehicle body 207, or the braking of each of wheels 209. Additionally, such posture control can be utilized in a variety of moving objects such as a two-legged walking robot, an aircraft, a helicopter, and the like. The gyro sensor 510 can be incorporated in realization of the posture control.

As illustrated in FIGS. 20B and 20C, the circuit device of the embodiment can be applied to a variety of electronic apparatuses such as digital still cameras, biological information detection apparatuses (wearable health apparatuses, for example, pulse meter, pedometer, activity meter, or the like), or the like. For example, it is possible to perform the image stabilization or the like using a gyro sensor or an acceleration sensor, for example, in a digital still camera. In addition, it is possible to detect body movement or a movement state of a user by using a gyro sensor or an acceleration sensor in the biological information detecting apparatus. In addition, as illustrated in FIG. 20D, the circuit device of the embodiment can also be applied to a movable part (arm and joints) and a main body of the robot. The robot can be implemented in any one of the moving object (running and walking robot) and the electronic apparatus (non-running and non-walking robot). For example, the circuit device of the embodiment in autonomous running can be used in a case of the running and walking robot.

In addition, as described above, the embodiment is described in detail. However, those skilled in the art can easily understand the fact that various modifications are possible without substantially departing from the scope of the invention. Accordingly, such modifications are intended to be included within the scope of the invention. For example, terms (angular velocity information, oscillation element, gyro sensor, and the like) that are commonly described, at least once with more broad or different synonymous terms (physical quantity information, angular velocity sensor element, physical quantity detection apparatus, and the like), in the specification or drawings, can be replaced by the different term, even in another place of the specification or drawings. In addition, the configuration of the circuit device, the physical quantity detection apparatus, the electronic apparatus, the moving object, or the like, and the configuration of the oscillation element are not limited to those described in the embodiment, and various modifications can be implemented.

The entire disclosure of Japanese Patent Application No. 2015-068078, filed Mar. 30, 2015 is expressly incorporated by reference herein.

What is claimed is:

1. A circuit device comprising:
a drive circuit that drives a physical quantity transducer;
an FLL circuit that includes a frequency comparator and an oscillator, and generates a clock signal with a signal from the drive circuit as a reference clock signal; and
a detection circuit that includes a circuit operated based on the clock signal and performs detection processing on a detection signal from the physical quantity transducer.

2. The circuit device according to claim 1,
wherein the frequency comparator includes a divider circuit that divides the reference clock signal, and a comparator that performs comparison processing of a comparison target value based on a divided clock signal from the divider circuit and the clock signal from the oscillator, and a reference value of the comparison target value.

3. The circuit device according to claim 2,
wherein the frequency comparator further includes a counter that outputs, as the comparison target value, a count value measured by counting a measurement period defined by the divided clock signal based on the clock signal.

4. The circuit device according to claim 2,
wherein in a case where the reference value is SC, a division ratio of the divider circuit is DR, a frequency of a signal from the drive circuit is FR, and a frequency of the clock signal output from the oscillator is FV, FV=(SC/DR)×FR is satisfied.

5. The circuit device according to claim 3,
wherein in a case where the reference value is SC, a division ratio of the divider circuit is DR, a frequency of a signal from the drive circuit is FR, and a frequency of the clock signal output from the oscillator is FV, FV=(SC/DR)×FR is satisfied.

6. The circuit device according to claim 4,
wherein the SC/DR is a decimal.

7. The circuit device according to claim 5,
wherein the SC/DR is a decimal.

8. The circuit device according to claim 4,
wherein the SC is a decimal.

9. The circuit device according to claim 5,
wherein the SC is a decimal.

10. The circuit device according to claim 4,
wherein the circuit is operated by an operational signal based on the clock signal, and the SC/DR is set so as to satisfy j×FR≠FV/i, in a case where i is an integer equal to or greater than one, j is an integer equal to or greater than one, and a frequency of the operational signal is FV/i.

11. The circuit device according to claim 5,
wherein the circuit is operated by an operational signal based on the clock signal, and the SC/DR is set so as to satisfy j×FR≠FV/i, in a case where i is an integer equal to or greater than one, j is an integer equal to or greater than one, and a frequency of the operational signal is FV/i.

12. The circuit device according to claim 1,
wherein the oscillator includes a CR oscillation circuit that sets an oscillation frequency setting value based on an output of the frequency comparator, and oscillates based on the oscillation frequency setting value.

13. The circuit device according to claim 12,
wherein the CR oscillation circuit includes at least one of a variable capacitance circuit and a variable resistance circuit, and
wherein an oscillation frequency of the CR oscillation circuit is set by setting a capacitance value of the variable capacitance circuit or a resistance value of the variable resistance circuit according to the oscillation frequency setting value.

14. The circuit device according to claim 12,
wherein the CR oscillation circuit includes a variable capacitance circuit and a variable resistance circuit,
wherein the variable resistance circuit has a plurality of resistance elements connected in series, and a plurality of fuse elements each of which is provided in parallel with each resistance element of the plurality of resistance elements, and
wherein the variable capacitance circuit is a circuit of which a capacitance value is set according to the oscillation frequency setting value.

15. The circuit device according to claim 1, further comprising:
a loop filter provided between the frequency comparator and the oscillator.

16. The circuit device according to claim 15,
wherein the loop filter includes an integrator that integrates an output of the frequency comparator, and a gain processing unit that performs gain processing on an output of the integrator.

17. The circuit device according to claim 1,
wherein the detection circuit includes at least one of an A/D conversion circuit and a digital signal processing unit as the circuit operated based on the clock signal.

18. The circuit device according to claim 1, further comprising:
a controller that is operated based on the clock signal, and controls the drive circuit and the detection circuit.

19. An electronic apparatus comprising:
the circuit device according to claim 1.

20. A moving object comprising:
the circuit device according to claim 1.

* * * * *